(12) United States Patent
Kim et al.

(10) Patent No.: US 10,903,301 B2
(45) Date of Patent: Jan. 26, 2021

(54) DISPLAY DEVICE

(71) Applicant: SAMSUNG DISPLAY CO., LTD., Yongin-si (KR)

(72) Inventors: Yang Wan Kim, Yongin-si (KR); Hyung Jun Park, Yongin-si (KR); Jae Yong Lee, Yongin-si (KR); Byung Sun Kim, Yongin-si (KR); Su Jin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/735,611

(22) Filed: Jan. 6, 2020

(65) Prior Publication Data

US 2020/0144355 A1 May 7, 2020

Related U.S. Application Data

(63) Continuation of application No. 16/250,849, filed on Jan. 17, 2019, now Pat. No. 10,529,792, which is a
(Continued)

(30) Foreign Application Priority Data

Nov. 15, 2016 (KR) .................. 10-2016-0152134

(51) Int. Cl.
*H01L 29/08* (2006.01)
*H01L 27/32* (2006.01)
(Continued)

(52) U.S. Cl.
CPC ........ *H01L 27/3276* (2013.01); *H01L 27/124* (2013.01); *H01L 27/3258* (2013.01);
(Continued)

(58) Field of Classification Search
CPC ... H01L 27/32; H01L 27/3276; H01L 27/124; H01L 27/3258; H01L 27/3262
See application file for complete search history.

(56) References Cited

U.S. PATENT DOCUMENTS 7,427,833 B2 9/2008 Fish et al.
2005/0179374 A1 8/2005 Kwak
(Continued)

FOREIGN PATENT DOCUMENTS

| EP | 2091575 B1 | 6/2012 |
| KR | 10-0960908 B1 | 6/2010 |
| WO | WO 2008/068486 A2 | 6/2008 |

OTHER PUBLICATIONS

EPO Extended Search Report dated Apr. 5, 2018, for corresponding European Patent Application No. 17201776.6 (8 pages).

*Primary Examiner* — Phuc T Dang
(74) *Attorney, Agent, or Firm* — Lewis Roca Rothgerber Christie LLP

(57) ABSTRACT

A display device includes: a substrate; pixels, the pixels each including at least one transistor and a light emitting device connected to the transistor; data lines and scan lines connected to the pixels; and a power line supplying power to the light emitting device. The transistor includes an active pattern on the substrate, source and drain electrodes each connected to the active pattern, a gate electrode on the active pattern, an interlayer insulating layer covering the gate electrode, the interlayer insulating layer including a first interlayer insulating layer, a second interlayer insulating layer, and a third interlayer insulating layer, which are sequentially stacked, and a protective layer provided on the interlayer insulating layer. The third interlayer insulating layer includes a concave part in a region in which the light
(Continued)

emitting device and the second conductive layer overlap with each other, and the second conductive layer is in the concave part.

15 Claims, 17 Drawing Sheets

Related U.S. Application Data continuation of application No. 15/717,548, filed on Sep. 27, 2017, now Pat. No. 10,199,449.

(51) Int. Cl.
    *H01L 27/12*     (2006.01)
    *G09G 3/3233*     (2016.01)

(52) U.S. Cl.
    CPC ...... *H01L 27/3262* (2013.01); *H01L 27/3265* (2013.01); *H01L 27/3279* (2013.01); *G09G 3/3233* (2013.01); *G09G 2300/0426* (2013.01); *H01L 2251/5315* (2013.01)

(56) References Cited

U.S. PATENT DOCUMENTS

| | | |
|---|---|---|
| 2007/0035239 A1 | 2/2007 | Kang et al. |
| 2010/0200861 A1* | 8/2010 | Lee .................. H01L 27/3276 257/72 |
| 2014/0158995 A1 | 6/2014 | Park |
| 2014/0361273 A1* | 12/2014 | Nozawa ............. H01L 51/524 257/40 |
| 2016/0035807 A1 | 2/2016 | Shi et al. |
| 2016/0118449 A1* | 4/2016 | Sato .................. H01L 27/3246 257/89 |
| 2016/0126303 A1 | 5/2016 | Kwon et al. |
| 2016/0172425 A1 | 6/2016 | Lee |
| 2016/0210905 A1 | 7/2016 | Lee et al. |
| 2016/0322440 A1 | 11/2016 | Murata |
| 2017/0077199 A1 | 3/2017 | Nguyen et al. |
| 2017/0249896 A1 | 8/2017 | Kim et al. |

* cited by examiner

DISPLAY DEVICE

CROSS-REFERENCE TO RELATED APPLICATION

This application is a continuation of U.S. patent application Ser. No. 16/250,849, filed Jan. 17, 2019, now U.S. Pat. No. 10,529,792, which is a continuation of U.S. patent application Ser. No. 15/717,548, filed Sep. 27, 2017, now U.S. Pat. No. 10,199,449, which claims priority to and the benefit of Korean Patent Application No. 10-2016-0152134, filed Nov. 15, 2016, the entire content of all of which is incorporated herein by reference.

BACKGROUND

1. Field

Embodiments of the present disclosure relate to a display device.

2. Description of the Related Art

A display device includes a plurality of pixels each including a display element. Each pixel includes lines and at least one transistor connected to the lines. The at least one transistor drives the display element.

The transistor is electrically connected to the display element to drive the display element using a signal applied from the lines.

At least some of the lines may overlap with the display element. The lines overlapping with the display element may form a step difference at a lower portion of the display device. The step difference may cause surface non-uniformity of the display element, and the surface non-uniformity of the display element may cause white angle dependency (WAD) according to viewing angles of the display device.

SUMMARY

Aspects of embodiments of the present disclose are directed toward a display device having improved display quality.

According to an embodiment of the present disclosure, a display device includes: a substrate including a pixel region and a peripheral region; pixels in the pixel region of the substrate, the pixels including at least one transistor and a light emitting device connected to the transistor; data lines and scan lines connected to the pixels; and a power line to supply power to the light emitting device. The transistor includes an active pattern provided on the substrate, source and drain electrodes each connected to the active pattern, a gate electrode on the active pattern with a gate insulating layer interposed therebetween, an interlayer insulating layer covering the gate electrode, the interlayer insulating layer including a first interlayer insulating layer, a second interlayer insulating layer, and a third interlayer insulating layer, which are sequentially stacked, and a protective layer on the interlayer insulating layer. The power line includes a first conductive layer parallel to the data line, the first conductive layer being on the second interlayer insulating layer, and a second conductive layer provided on the third interlayer insulating layer, the second conductive layer being connected to the first conductive layer. The light emitting device is on the protective layer. The third interlayer insulating layer includes a concave part in a region in which the light emitting device and the second conductive layer overlap with each other. The second conductive layer is in the concave part.

The protective layer may include an organic insulating layer.

The third interlayer insulating layer may include: a first sub-insulating layer including an inorganic insulating layer; and a second sub-insulating layer on the first sub-insulating layer, the second sub-insulating layer including an organic insulating layer.

The concave part may include a region in which a portion of the second sub-insulating layer is removed to expose the first sub-insulating layer therethrough.

The second conductive layer may be on the first sub-insulating layer.

The concave part may include a concave region at which a partial thickness of the second sub-insulating layer is removed.

The third interlayer insulating layer may include an organic insulating layer. The concave part may expose the first conductive layer therethrough.

At the concave part, the second conductive layer may be in direct contact with the first conductive layer on the first conductive layer.

The second conductive layer includes first conductive lines extending in one direction and second conductive lines crossing the first conductive lines.

Each of the pixels may further include a storage capacitor. The storage capacitor may include a lower electrode at the same layer as the gate electrode and an upper electrode provided on the first interlayer insulating layer.

The first conductive lines may extend in a direction parallel to one of the data lines and the scan lines.

The protective layer may have a planarized surface.

In the protective layer, a thickness of a region corresponding to the concave part may be greater than that of the other region.

The light emitting device may include a first electrode on the protective layer, a second electrode on the first electrode, and an emitting layer between the first electrode and the second electrode.

The data lines may be at the same layer as the first conductive layer.

According to an embodiment of the present disclosure, a display device includes: a substrate including a pixel region and a peripheral region; pixels in the pixel region of the substrate, the pixels including at least one transistor and a light emitting device connected to the transistor; data lines and scan lines connected to the pixels; and a power line to supply power to the light emitting device. The transistor includes an active pattern on the substrate, source and drain electrodes each connected to the active pattern, a gate electrode on the active pattern with a gate insulating layer interposed therebetween, an interlayer insulating layer covering the gate electrode, the interlayer insulating layer including a first interlayer insulating layer, a second interlayer insulating layer, and a third interlayer insulating layer, which are sequentially stacked, and a protective layer provided on the interlayer insulating layer. The light emitting device includes a first electrode disposed on the protective layer, a second electrode disposed on the first electrode, and an emitting layer between the first electrode and the second electrode. The power line includes a first conductive layer parallel to the data line, the first conductive layer being on the second interlayer insulating layer, and a second conductive layer on the third interlayer insulating layer, the second conductive layer being connected to the first conductive layer. The third interlayer insulating layer includes a concave part in a region in which the light emitting device and the second conductive layer overlap with each other, and the second conductive layer is in the concave part. An interface between the protective layer and the first electrode is a flat surface.

The protective layer may include an organic insulating layer.

In the protective layer, a thickness of a region corresponding to the concave part may be greater than that of the other region.

The third interlayer insulating layer may include a first sub-insulating layer including an inorganic insulating layer and a second sub-insulating layer on the first sub-insulating layer, the second sub-insulating layer including an organic insulating layer.

The concave part may be a region in which a portion of the second sub-insulating layer is removed to expose the first sub-insulating layer therethrough. The second conductive layer may be on the first sub-insulating layer.

The concave part may include a concave region at which a partial thickness of the second sub-insulating layer is removed.

The third interlayer insulating layer may include an organic insulating layer. The concave part may expose the first conductive layer therethrough. At the concave part, the second conductive layer may be in direct contact with the first conductive layer on the first conductive layer.

The second conductive layer may include first conductive lines extending in one direction and second conductive lines crossing the first conductive lines.

The first conductive lines may extend in a direction parallel to the data lines or may extend in a direction parallel to the scan lines.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration.

DETAILED DESCRIPTION

Figure 1:
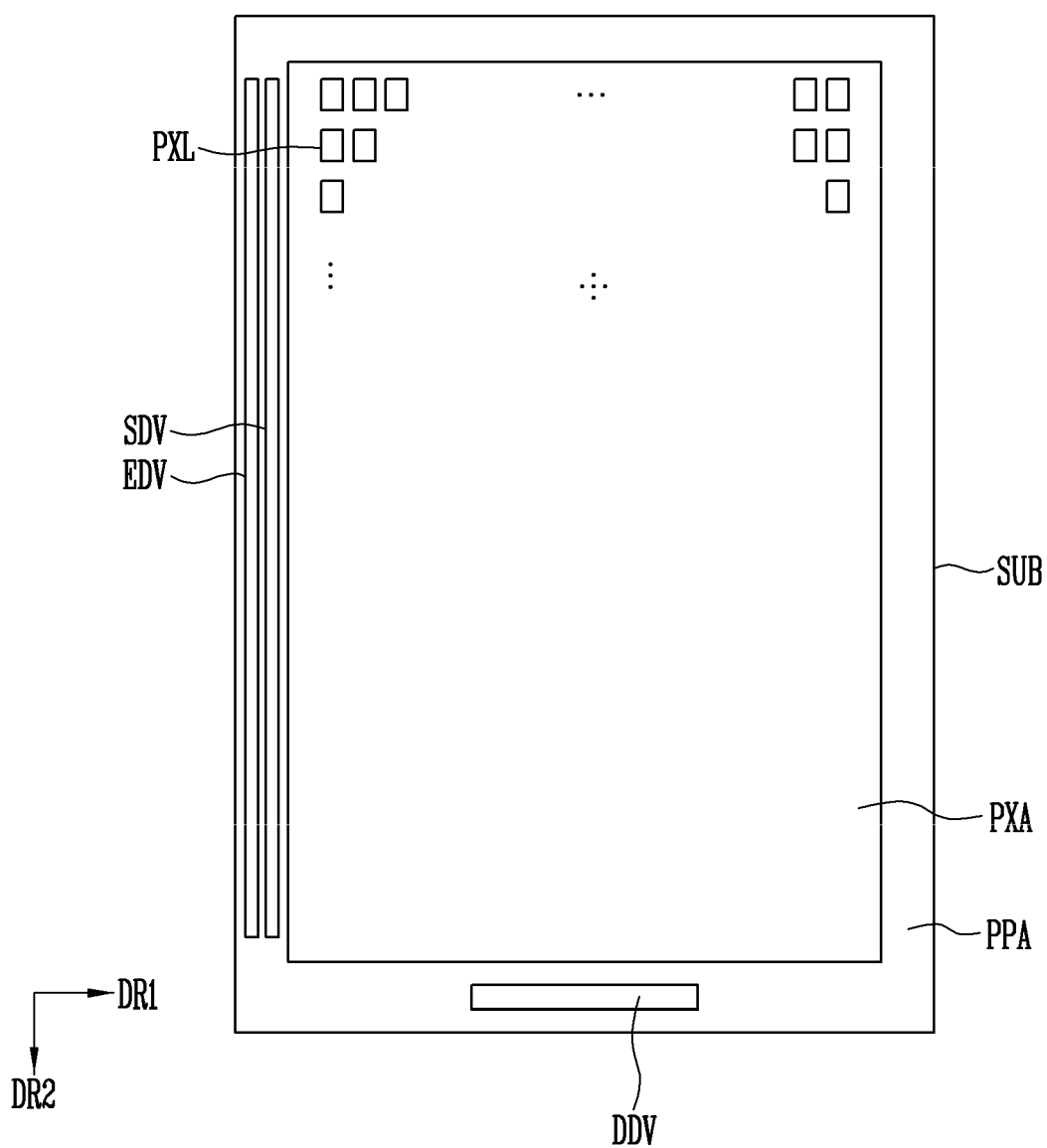
FIG. 1 is a plan view illustrating a display device according to an embodiment of the present disclosure.

As the invention allows for various changes and numerous embodiments, particular embodiments will be illustrated in the drawings and described in detail in the written description. Features and methods of the embodiments of the present invention will become clear from the detailed description of the embodiments together with the drawings. However, the present exemplary embodiments may have different forms and should not be construed as being limited to the descriptions set forth herein.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the spirit and scope of the present invention.

Like numbers refer to like elements throughout. In the drawings, the thickness of certain lines, layers, components, elements or features may be exaggerated for clarity.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

Spatially relative terms, such as "top," "bottom," "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Furthermore, "connection," "connected," etc., may also refer to "electrical connection," "electrically connected," etc., depending on the context in which such terms are used as would be understood by those skilled in the art. When an element or layer is referred to as being "directly on," "directly connected to," "directly coupled to," "directly connected with," "directly coupled with," or "immediately adjacent to" another element or layer, there are no intervening elements or layers present.

As used herein, "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Features described in relation to one or more embodiments of the present invention are available for use in conjunction with features of other embodiments of the present invention. For example, features described in a first embodiment may be combined with features described in a second embodiment to form a third embodiment, even though the third embodiment may not be specifically described herein.

Hereinafter, exemplary embodiments of the present disclosure will be described in more detail with reference to the accompanying drawings.

FIG. 1 is a plan view illustrating a display device according to an embodiment of the present disclosure.

Referring to FIG. 1, the display device according to the embodiment of the present disclosure may include a substrate SUB, pixels PXL provided on the substrate SUB, a drive unit (e.g., a driver) provided on the substrate SUB, the drive unit driving the pixels PXL, and a line unit connecting the pixels PXL and the drive unit.

The substrate SUB may include a pixel region PXA and a peripheral region PPA. The pixel area PXA may be a region in which the pixels PXL displaying an image are provided. Each of the pixels PXL will be described later. The peripheral region PPA is a region in which the pixels PXL are not provided, and may be a region in which an image is not displayed. The drive unit for driving the pixels PXL and some of lines connecting the pixels PXL and the drive unit may be provided in the peripheral region PPA. The peripheral region PPA corresponds to a bezel in a final display device, and the width of the bezel may be determined according to the width of the peripheral region PPA.

The pixel region PXA may have various suitable shapes. For example, the pixel region PXA may be provided in various suitable shapes such as a closed-shape polygon including linear sides, a circle, an ellipse, etc., including curved sides, and a semicircle, a semi-ellipse, etc., including linear and curved sides. When the pixel region PXA includes a plurality of regions, each region may also be provided in various suitable shapes such as a closed-shape polygon including linear sides, a circle, an ellipse, etc., including curved sides, and a semicircle, a semi-ellipse, etc., including linear and curved sides. In addition, areas of the plurality of regions may be the same, substantially the same, or different from one another.

In this embodiment, a case in which the pixel region PXA is provided as one region having a quadrangular shape including linear sides is described as an example.

The peripheral region PPA may be provided at one or more sides of the pixel region PXA. In an embodiment of the present disclosure, the peripheral region PPA may surround the circumference of the pixel region PXA. In an embodiment of the present disclosure, the peripheral region PPA may include a lateral part extending in the width direction thereof and a longitudinal part extending in the length direction thereof. The longitudinal part of the peripheral region PPA may be provided in a pair to be spaced apart from each other along the width direction of the pixel region PXA.

The pixels PXL may be provided in the pixel region PXA on the substrate SUB. Each of the pixels PXL is a unit (e.g., a minimum unit) for displaying an image, and may be provided in plurality. Each of the pixels PXL may include an organic light emitting device that emits white light and/or color light. Each of the pixels PXL may emit light of one of red, green, and blue, but the present disclosure is not limited thereto. For example, each of the pixels PXL may emit light of a color such as cyan, magenta, or yellow.

The pixels PXL may be arranged in a matrix form along rows extending in a first direction DR1 and columns extending in a second direction DR2. However, the arrangement form of the pixels PXL is not limited, and the pixels PXL may be arranged in various suitable forms. For example, some of the pixels PXL may be arranged such that the first direction DR1 becomes a row direction, but other some of the pixels PXL may be arranged such that a direction different from the first direction, e.g., a direction oblique to the first direction DR1 becomes a row direction. Alternatively, the pixels PXL may be arranged such that a direction inclined to the first direction DR1 and the second direction DR2 becomes a column direction and such that a direction crossing (e.g., intersecting) the column direction becomes a row direction. Here, the column direction may also be inclined to the first direction DR1 and the second direction DR2.

The drive unit provides a signal to each of the pixels PXL through the line unit, and accordingly, the driving of the pixel PXL can be controlled. In FIG. 1, the line unit is omitted for convenience of description. The line unit will be described later in more detail.

The drive unit may include a scan driver SDV providing a scan signal to the pixel PXL through a scan line, a light emitting driver EDV providing a light emitting control signal to the pixel PXL through a light emitting control line, a data driver DDV providing a data signal to the pixel PXL through a data line, and a timing controller. The timing controller may control the scan driver SDV, the light emitting driver EDV, and the data driver DDV.

The scan driver SDV may be disposed at the longitudinal part in the peripheral region PPA. Because the longitudinal part of the peripheral region PPA is provided in a pair to be spaced apart from each other along the width direction of the pixel region PXA, the scan driver SDV may be disposed at one or more of the longitudinal parts in the peripheral region PPA. The scan driver SDV may extend along the length direction of the peripheral region PPA.

In an embodiment of the present disclosure, the scan driver SDV may be directly mounted on the substrate SUB. When the scan driver SDV is directly mounted on the substrate SUB, the scan driver SDV may be formed together with the pixels PXL in a process of forming the pixels PXL. However, the mounting position and forming method of the scan driver SDV are not limited thereto. For example, the scan driver SDV may be formed on a separate chip to be provided in a chip on glass form on the substrate SUB. Alternatively, the scan driver SDV may be mounted on a printed circuit board to be connected to the substrate SUB through a connection.

Similarly to the scan driver SDV, the light emitting driver EDV may be disposed at the longitudinal part in the peripheral region PPA. The light emitting driver EDV may be disposed at one or more of the longitudinal parts in the peripheral region PPA. The light emitting driver EDV may extend along the length direction of the peripheral region PPA.

In an embodiment of the present disclosure, the light emitting driver EDV may be directly mounted on the substrate SUB. When the light emitting driver EDV is directly mounted on the substrate SUB, the light emitting driver EDV may be formed together with the pixels PXL in a process of forming the pixels PXL. However, the mounting position and forming method of the light emitting driver EDV are not limited thereto. For example, the light emitting driver EDV may be formed on a separate chip to be provided in a chip on glass form on the substrate SUB. Alternatively, the light emitting driver EDV may be mounted on a printed circuit board to be connected to the substrate SUB through a connection.

In an embodiment of the present disclosure, a case in which the scan driver SDV and the light emitting driver EDV are adjacent to each other and formed at any one of the pair of longitudinal parts of the peripheral region PPA is illustrated as an example. However, the present disclosure is not limited thereto, and the arrangement of the scan driver SDV and the light emitting driver EDV may be modified in various suitable manners. For example, the scan driver SDV may be provided at one of the longitudinal parts of the peripheral region PPA, and the light emitting driver EDV may be provided at the other of the longitudinal parts of the peripheral region PPA. Alternatively, the scan driver SDV may be provided at both of the longitudinal parts of the peripheral region PPA, and the light emitting driver EDV may be provided at only one of the longitudinal parts of the peripheral region PPA.

The data driver DDV may be disposed in the peripheral region PPA. Particularly, the data driver DDV may be disposed at the lateral part of the peripheral region PPA. The data driver DDV may extend along the width direction of the peripheral region PPA.

In an embodiment of the present disclosure, positions of the scan driver SDV, the light emitting driver EDV, and/or the data driver DDV may be changed.

The timing controller may be connected in various suitable manners to the scan driver SDV, the light emitting driver EDV, and the data driver DDV through lines. The position at which the timing controller is disposed is not limited herein. For example, the timing controller may be mounted on a flexible printed circuit board, to be connected to the scan driver SDV, the light emitting driver EDV, and the data driver DDV through the printed circuit board. The printed circuit board may be disposed at various suitable positions, e.g., at one side of the substrate SUB, on a back surface of the substrate SUB, and the like.

Figure 2:
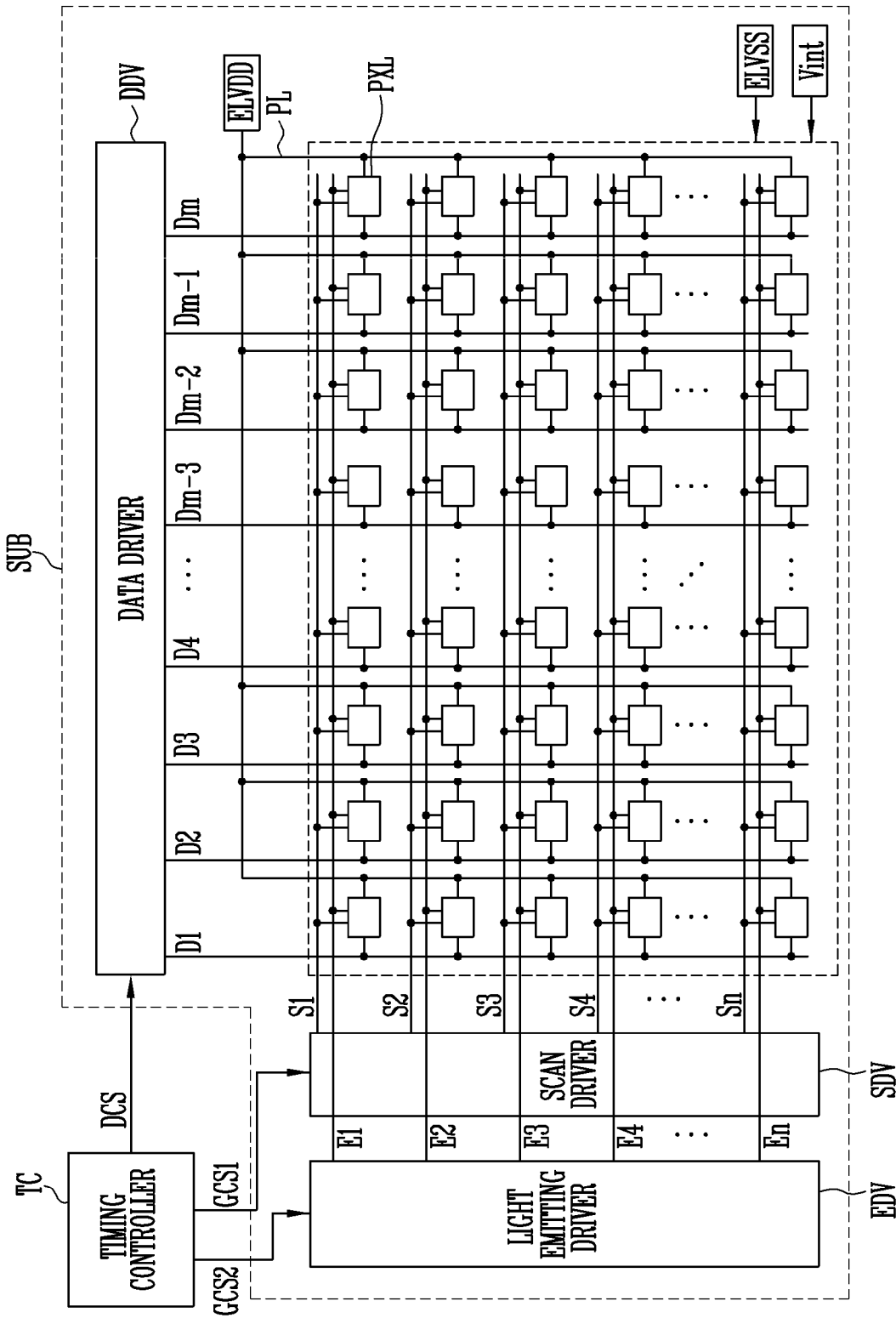
FIG. 2 is a block diagram illustrating pixels and a driver in a display device according to an embodiment of the present disclosure.

FIG. 2 is a block diagram illustrating pixels and a drive unit in a display device according to an embodiment of the present disclosure.

Referring to FIG. 2, the display device according to the embodiment of the present disclosure may include pixels PXL, a drive unit, and a line unit.

The pixels PXL may be provided in plurality. The drive unit may include a scan driver SDV, a light emitting driver EDV, a data driver DDV, and a timing controller TC. In FIG. 2, positions of the scan driver SDV, the light emitting driver EDV, the data driver DDV, and the timing controller TC are set for convenience of description. When an actual display device is implemented, the scan driver SDV, the light emitting driver EDV, the data driver DDV, and the timing controller TC may be disposed at other suitable positions in the display device.

The line unit provides signals from the drive unit to each of the pixels PXL, and may include scan lines, data lines, light emitting control lines, a power line PL, and an initialization power line. The scan lines may include a plurality of scan lines S1 to Sn, and the light emitting control lines may include a plurality of light emitting control lines E1 to En. The data lines may include a plurality of data lines D1 to Dm. The data lines D1 to Dm and the power line PL may be connected to the pixels PXL.

The pixels PXL may be arranged in a pixel region PXA. The pixels PXL may be connected to the scan lines S1 to Sn, the light emitting control lines E1 to En, the data lines D1 to Dm, and the power line PL. The pixels PXL may be supplied with a data signal from the data lines D1 to Dm when a scan signal is supplied from the scan lines S1 to Sn.

Also, the pixels PXL may be supplied with a first power source ELVDD, a second power line ELVSS, and an initialization power source Vint from the outside. Here, the first power source ELVDD may be applied through the power line PL.

Each of the pixels PXL may include a driving transistor and an organic light emitting diode. The driving transistor may control the amount of current flowing from the first power source ELVDD to the second power source ELVSS via the organic light emitting diode, corresponding to the data signal. Here, before the data signal is supplied, a gate electrode of the driving transistor may be initialized by a voltage of the initialization power source Vint. To this end, the initialization power source Vint may be set to a lower voltage than the data signal.

The scan driver SDV may supply the scan signal to the scan lines S1 to Sn in response to a first gate control signal GCS1 from the timing controller TC. For example, the scan driver SDV may sequentially supply the scan signal to the scan lines S1 to Sn. When the scan signals are sequentially supplied to the scan lines S1 to Sn, the pixels PXL may be sequentially selected in units of horizontal lines.

The light emitting driver EDV may supply the light emitting control signal to the light emitting control lines E1 to En in response to a second gate control signal GCS2 from the timing controller TC. For example, the light emitting driver EDV may sequentially supply the light emitting control signal to the light emitting control lines E1 to En.

Here, the light emitting control signal may be set to have a wider width than the scan signal. For example, a light emitting control signal supplied to an ith (i is a natural number) light emitting control line Ei may be supplied to overlap with, for at least one period, a scan signal supplied to an (i−1)th scan line Si−1 and a scan signal supplied to an ith scan line Si.

Additionally, the light emitting control signal may be set to a gate-off voltage (e.g., a high voltage) such that transistors included in the pixels PXL can be turned off, and the scan signal may be set to a gate-on voltage (e.g., a low voltage) such that the transistors included in the pixels PXL can be turned on.

The data driver DDV may supply the data signal to the data lines D1 to Dm in response to a data control signal DCS. The data signal supplied to the data lines D1 to Dm may be supplied to pixels PXL selected by the scan signal.

The timing controller TC may supply, to the scan drivers SDV and the light emitting drivers EDV, the gate control signals GCS1 and GCS2 generated based on timing signals supplied from the outside. Also, the timing controller TC may supply the data control signal DCS to the data driver DDV.

A start pulse and clock signals may be included in each of the gate control signals GCS1 and GCS2. The start pulse may control a timing of a first scan signal or a first light emitting control signal. The clock signals may be used to shift the start pulse.

A source start pulse and clock signals may be included in the data control signal DCS. The source start pulse may control a sampling start time of data. The color signals may be used to control a sampling operation.

Figure 3:
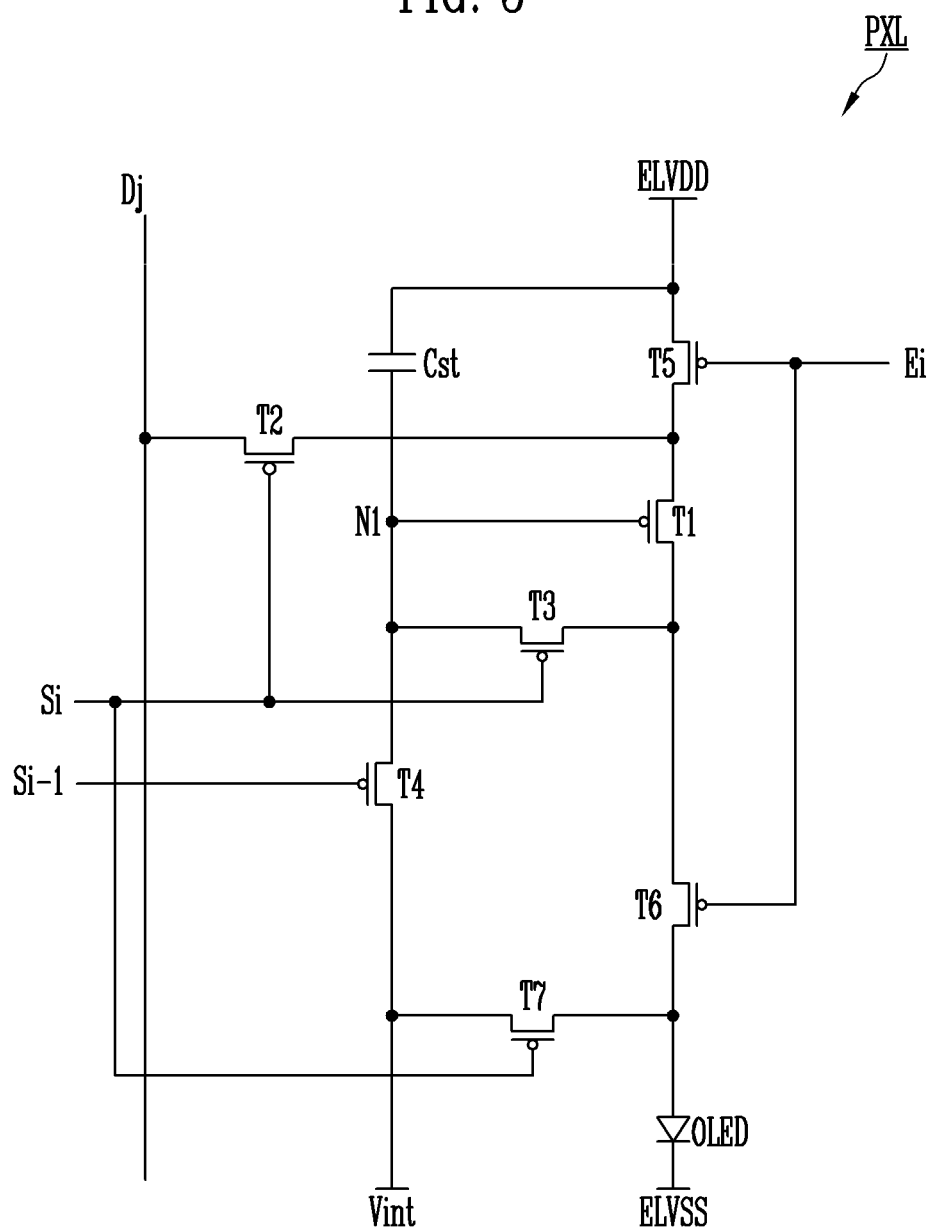
FIG. 3 is an equivalent circuit diagram illustrating an embodiment of a pixel shown in FIG. 2.

FIG. 3 is an equivalent circuit diagram illustrating an embodiment of a pixel shown in FIG. 2. For convenience of description, a pixel connected to a jth data line Dj and an ith scan line Si will be illustrated in FIG. 3.

Referring to FIGS. 2 and 3, the pixel PXL according to the embodiment of the present disclosure may include an organic light emitting device OLED, a first transistor T1, a second transistor T2, a third transistor T3, a fourth transistor T4, a fifth transistor T5, a sixth transistor T6, a seventh transistor T7, and a storage capacitor Cst.

An anode of the organic light emitting device OLED may be connected to the first transistor T1 via the sixth transistor T6, and a cathode of the organic light emitting device OLED may be connected to a second power source ELVSS. The organic light emitting device OLED may generate light with a luminance (e.g., a predetermined luminance) corresponding to the amount of current supplied from the first transistor T1.

A first power source ELVDD may be set to a higher voltage than the second power source ELVSS such that current can flow in the organic light emitting device OLED.

The seventh transistor T7 may be connected between an initialization power source Vint and the anode of the organic light emitting device OLED. In addition, a gate electrode of the seventh transistor T7 may be connected to the ith scan line Si. The seventh transistor T7 may be turned on when a scan signal is supplied (e.g., supplied at a low level) to the ith scan line Si, to supply a voltage of the initialization power source Vint to the anode of the organic light emitting device OLED. Here, the initialization power source Vint may be set to a lower voltage than a data signal.

The sixth transistor T6 may be connected between the first transistor T1 and the organic light emitting device OLED. In addition, a gate electrode of the sixth transistor T6 may be connected to an ith light emitting control line Ei. The sixth transistor T6 may be turned off when a light emitting control signal is supplied (e.g., supplied at a high level) to the ith light emitting control line Ei, and otherwise may be turned on.

The fifth transistor T5 may be connected between the first power source ELVDD and the first transistor T1. In addition, a gate electrode of the fifth transistor T5 may be connected to the ith light emitting control line Ei. The fifth transistor T5 may be turned off when a light emitting control signal is supplied (e.g., supplied at a high level) to the ith light emitting control line Ei, and otherwise may be turned on.

A first electrode of the first transistor (drive transistor) T1 may be connected to the first power source ELVDD via the fifth transistor T5, and a second electrode of the first transistor T1 may be connected to the anode of the organic light emitting device OLED via the sixth transistor T6. In addition, a gate electrode of the first transistor T1 may be connected to a first node N1. The first transistor T1 may control the amount of current flowing from the first power source ELVDD to the second power source ELVSS via the organic light emitting device OLED, corresponding to a voltage of the first node N1. That is, the first power source ELVDD may be electrically connected to the anode of the organic light emitting device OLED through the first transistor T1.

The third transistor T3 may be connected between the second electrode of the first transistor T1 and the first node N1. In addition, a gate electrode of the third transistor T3 may be connected to the ith scan line Si. The third transistor T3 may be turned on when a scan signal is supplied (e.g., supplied at a low level) to the ith scan line Si, to allow the second electrode of the first transistor T1 to be electrically connected to the first node N1. Therefore, the first transistor T1 may be diode-connected when the third transistor T3 is turned on.

The fourth transistor T4 may be connected between the first node N1 and the initialization power source Vint. In addition, a gate electrode of the fourth transistor T4 may be connected to an (i−1)th scan line Si−1. The fourth transistor T4 may be turned on when a scan signal is supplied (e.g., supplied at a low level) to the (i−1)th scan line Si−1, to supply the voltage of the initialization power source Vint to the first node N1.

The second transistor T2 may be connected between the jth data line Dj and the first electrode of the first transistor T1. In addition, a gate electrode of the second transistor T2 may be connected to the ith scan line Si. The second transistor T2 may be turned on when a scan signal is supplied (e.g., supplied at a low level) to the ith scan line Si, to allow the jth data line Dj to be electrically connected to the first electrode of the first transistor T1.

The storage capacitor Cst may be connected between the first power source ELVDD and the first node N1. The storage capacitor Cst may store the data signal and a voltage corresponding to a threshold voltage of the first transistor T1.

In another embodiment of the present disclosure, the extending direction of the scan lines and the light emitting control lines may be differently set. For example, while, in the embodiment of the present disclosure, the scan lines and the light emitting control lines extend along a first direction DR1 that is the width direction thereof, the scan lines and light emitting control lines may extend along a second direction DR2 that is the length direction thereof.

Figure 4:
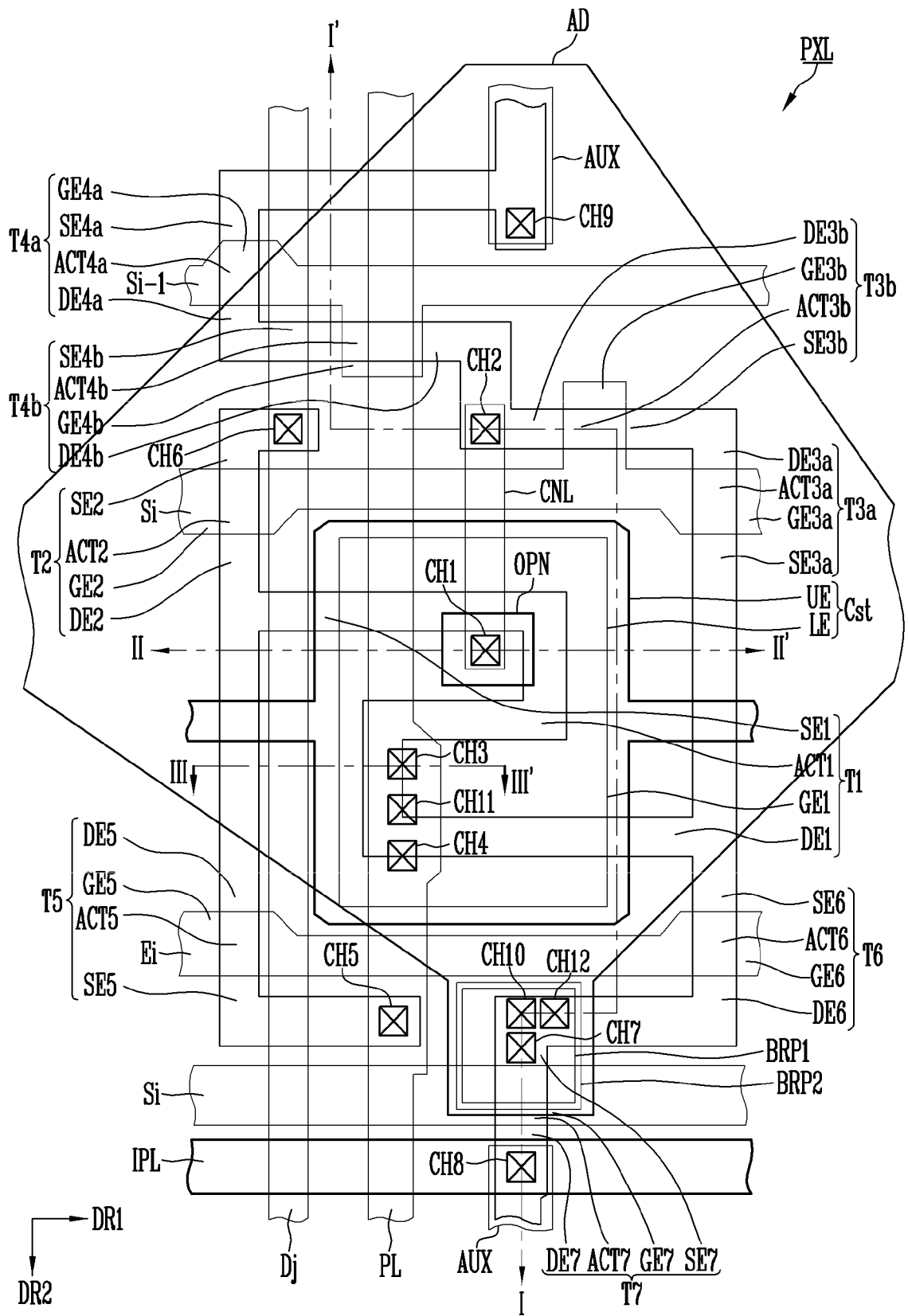
FIG. 4 is a plan view illustrating in detail the pixel shown in FIG. 3.
Figure 5:
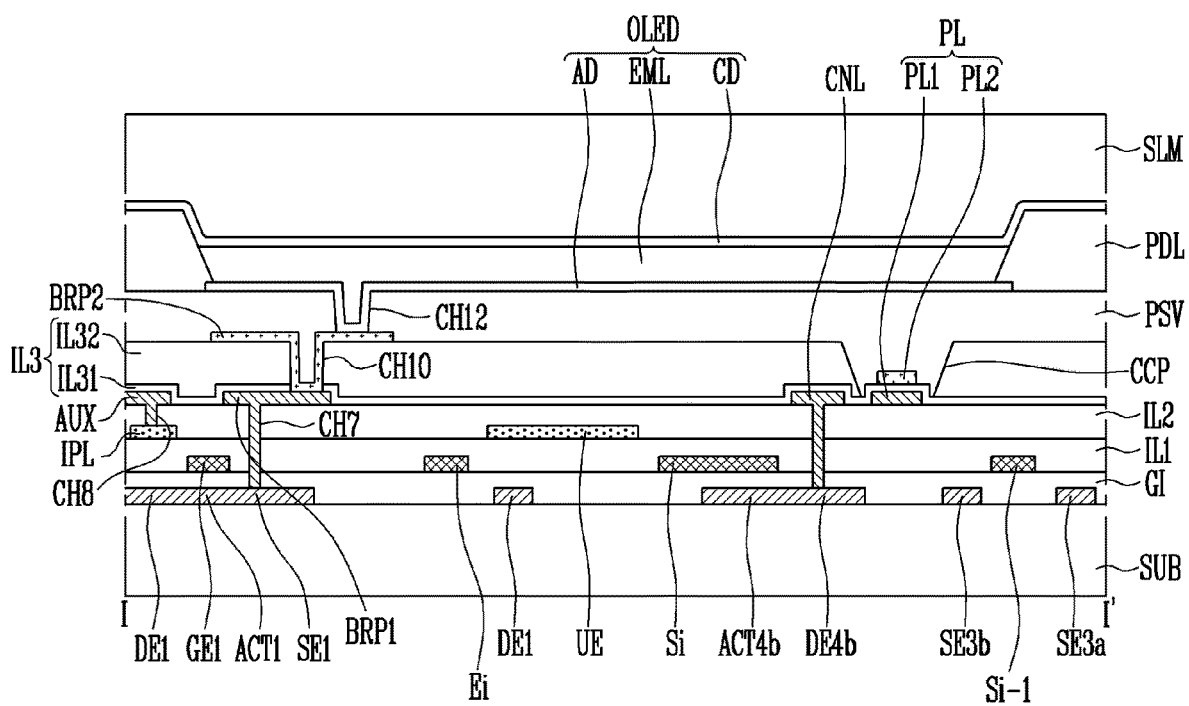
FIG. 5 is a sectional view taken along line I-I' of FIG. 4.
Figure 6:
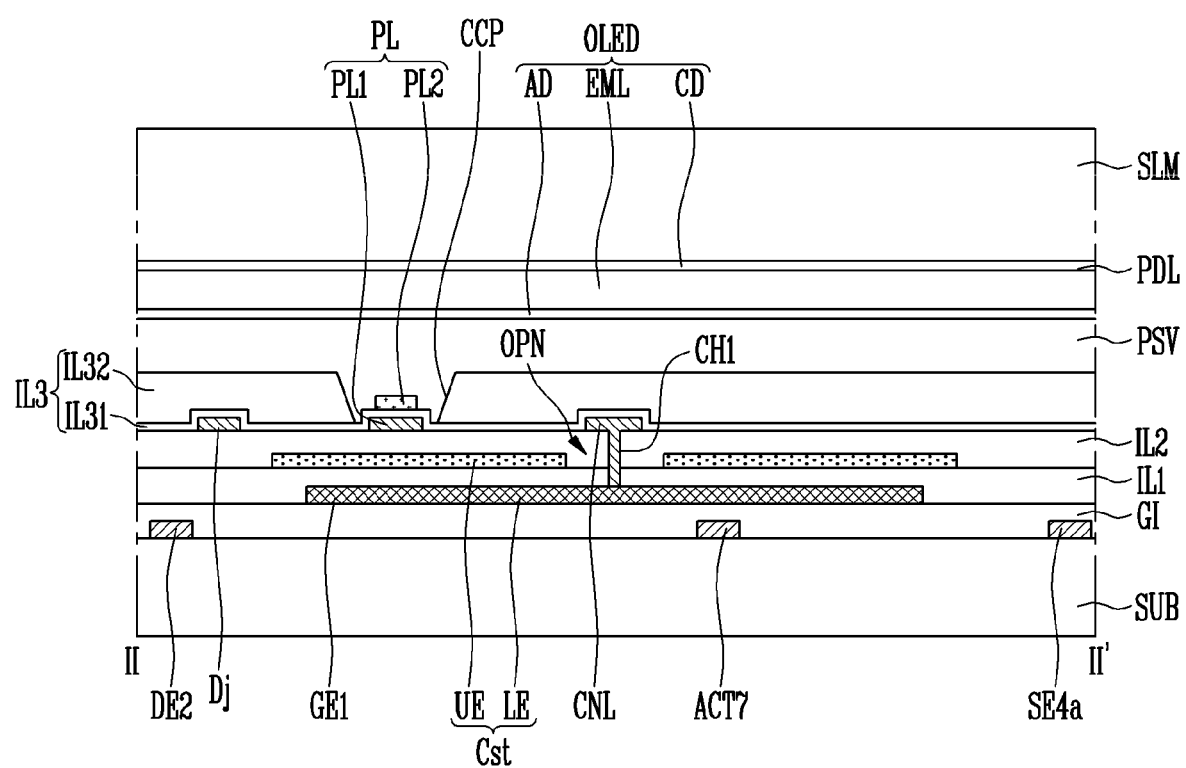
FIG. 6 is a sectional view taken along line II-II' of FIG. 4.
Figure 7:
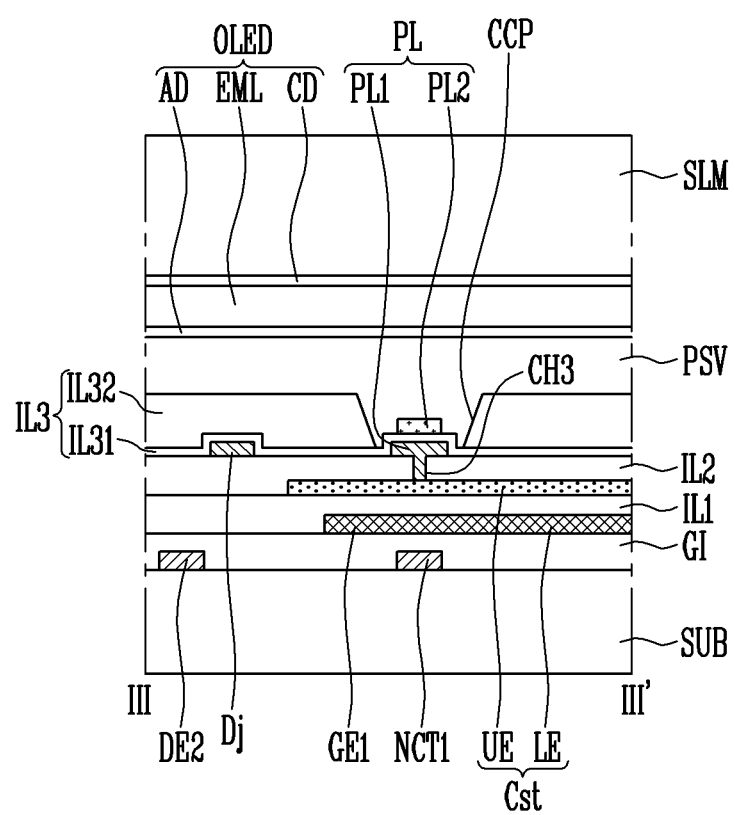
FIG. 7 is a sectional view taken along line III-III' of FIG. 4.

FIG. 4 is a plan view illustrating in detail the pixel shown in FIG. 3. FIG. 5 is a sectional view taken along line I-I' of FIG. 4. FIG. 6 is a sectional view taken along line II-II' of FIG. 4. FIG. 7 is a sectional view taken along line III-III' of FIG. 4.

Based on one pixel PXL disposed on an ith row and a jth column in the pixel region PXA, two scan lines Si-1 and Si, a light emitting control line Ei, a power line PL, and a data line Dj, which are connected to the one pixel PXL, are illustrated in FIGS. 4 to 7. In FIGS. 4 to 7, for convenience of description, a scan line on an (i-1)th row is referred to as an "(i-1)th scan line Si-1," a scan line on the ith row is referred to as an "ith scan line Si," a light emitting control line on the ith row is referred to as a "light emitting control line Ei," a data line on the jth column is referred to as a "data line Dj," and a power line on the jth column is referred to as a "power line PL."

Referring to FIGS. 4 to 7, the display device may include a substrate SUB, a line unit, and pixels PXL.

The substrate SUB may include a transparent insulating material to enable light to be transmitted therethrough. The substrate SUB may be a rigid substrate. For example, the substrate SUB may be one of a glass substrate, a quartz substrate, a glass ceramic substrate, and a crystalline glass substrate.

In addition, the substrate SUB may be a flexible substrate. Here, the substrate SUB may be one of a film substrate including a polymer organic material and/or a plastic substrate. For example, the substrate SUB may include at least one selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and may include a fiber reinforced plastic (FRP), etc.

The line unit provides signals to each of the pixels PXL, and may include scan lines Si-1 and Si, a data line Dj, a light emitting control line Ei, a power line PL, and an initialization power line IPL.

The scan lines Si-1 and Si may extend in a first direction DR1. The scan lines Si-1 and Si may include an (i-1)th scan line Si-1 and an ith scan line Si, which are sequentially arranged along a second direction DR2. The scan lines Si-1 and Si may receive a scan signal. For example, the (i-1)th scan line Si-1 may receive an (i-1)th scan signal. Pixels PXL1 on an ith row may be initialized by the (i-1)th scan signal applied to the (i-1)th scan line Si-1. The ith scan line Si may receive an ith scan signal. The ith scan line Si may branch off to be connected to different transistors.

The light emitting control line Ei may extend in the first direction DR1. The light emitting control line Ei is disposed to be spaced apart from the branching ith scan lines Si between the ith scan lines Si. The light emitting control line Ei may receive a light emitting control signal.

The data line Dj may extend in the second direction DR2. The data line Dj may receive a data signal.

The power line PL may extend in the second direction DR2. The power line PL may be disposed to be spaced apart from the data line Dj. The power line PL may receive the first power source (see ELVDD of FIGS. 2 and 3).

The initialization power line IPL may extend along the first direction DR1. The initialization power line IPL may be provided between a pixel PXL on an ith pixel row and a pixel PXL1 on an (i+1)th pixel row. The initialization power line IPL may receive the initialization power source Vint.

Each of the pixels PXL may include a first transistor T1, a second transistor T2, a third transistor T3, a fourth transistor T4, a fifth transistor T5, a sixth transistor T6, a seventh transistor T7, a storage capacitor Cst, and an organic light emitting device OLED.

The first gate electrode GE1 may be connected to a third drain electrode DE3 of the third transistor T3 and a fourth drain electrode DE4 of the fourth transistor T4. The connection line CNL may connect between the first gate electrode GE1 and the third and fourth drain electrodes DE3 and DE4. One end of the connection line CNL may be connected to the first gate electrode GE1 through a first contact hole CH1, and the other end of the connection line CNL may be connected to the third and fourth drain electrodes DE3 and DE4 through a second contact hole CH2.

In an embodiment of the present disclosure, the first active pattern ACT1, the first source electrode SE1, and the first drain electrode DE1 may be formed of a semiconductor layer not doped or doped with impurities. For example, the first source electrode SE1 and the first drain electrode DE1 may be formed of a semiconductor layer doped with impurities, and the active pattern ACT1 may be formed of a semiconductor layer not doped with impurities.

The first active pattern ACT1 has a bar shape extending in a direction (e.g., a predetermined direction), and may have a shape in which it is bent a plurality of times along the extending direction. The first active pattern ACT1 may overlap with the first gate electrode GE1 when viewed on a plane. As the first active pattern ACT1 is formed long, a channel region of the first transistor T1 can be formed long. Thus, the driving range of a gate voltage applied to the first transistor T1 can be widened. Accordingly, the gray scale of light emitted from the organic light emitting device OLED can be controlled (e.g., minutely controlled).

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, and a second source electrode SE2, and the second drain electrode DE2.

The second gate electrode GE2 may be connected to the ith scan line Si. The second gate electrode GE2 may be provided as a portion of the ith scan line Si or may be provided in a shape protruding from the ith scan line Si. In an embodiment of the present disclosure, the second active pattern ACT2, the second source electrode SE2, and the second drain electrode DE2 may be formed of a semiconductor not doped or doped with impurities. For example, the second source electrode SE2 and the second drain electrode DE2 may be formed of a semiconductor doped with impurities, and the second active pattern ACT2 may be formed of a semiconductor layer not doped with impurities. The second active pattern ACT2 corresponds to a portion overlapping with the second gate electrode GE2. One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may be provided in a double gate structure so as to prevent or reduce a leakage current. That is, the third transistor T3 may include a 3ath transistor T3a and a 3bth transistor T3b. The 3ath transistor T3a may include a 3ath gate electrode GE3a, a 3ath active pattern ACT3a, a 3ath source electrode SE3a, and a 3ath drain electrode DE3a. The 3bth transistor T3b may include a 3bth gate electrode GE3b, a 3bth active pattern ACT3a, a 3bth source electrode SE3b, and a 3bth drain electrode DE3b. Hereinafter, the 3ath gate electrode GE3a and the 3bth gate electrode GE3b are collectively referred to as a third gate electrode GE3, the 3ath active pattern ACT3a and the 3bth active pattern ACT3b are collectively referred to as a third active pattern ACT3, the 3ath source electrode SE3a and the 3bth source electrode SE3b are collectively referred to as the third source electrode SE3, and the 3ath drain electrode DE3a and the 3bth drain electrode DE3b are collectively referred to as the third drain electrode DE3.

The third gate electrode GE3 may be connected to the ith scan line Si. The third gate electrode GE3 may be provided as a portion of the ith scan line Si or may be provided in a shape protruding from the ith scan line Si. For example, the 3ath gate electrode GE3a may be provided in a shape protruding from the ith scan line Si, and the 3bth gate electrode GE3b may be provided as a portion of the ith scan line Si.

The third active pattern ACT3, the third source electrode SE3, and the third drain electrode DE3 may be formed of a semiconductor layer not doped or doped with impurities. For example, the third source electrode SE3 and the third drain electrode DE3 may be formed of a semiconductor layer doped with impurities, and the third active pattern ACT3 may be formed of a semiconductor layer not doped with impurities. The third active pattern ACT3 corresponds to a portion overlapping with the third gate electrode GE3. One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Also, the third drain electrode DE3 may be connected to the first gate electrode GE1 of the first transistor T1 through the connection line CNL, the second contact hole CH2, and the first contact hole CH1.

The fourth transistor T4 may be provided in a double gate structure so as to prevent or reduce a leakage current. That is, the fourth transistor T4 may include a 4ath transistor T4a and a 4bth transistor T4b. The 4ath transistor T4a may include a 4ath gate electrode GE4a, a 4ath active pattern ACT4a, a 4ath source electrode SE4a, and a 4ath drain electrode DE4a, and the 4bth transistor T4b may include a 4bth gate electrode GE4b, a 4bth active pattern ACT4b, a 4bth source electrode SE4b, and a 4bth drain electrode DE4b. Hereinafter, the 4ath gate electrode GE4a and the 4bth gate electrode GE4b are collectively referred to as a fourth gate electrode GE4, the 4ath active pattern ACT4a and the 4bth active pattern ACT4b are collectively referred to as a fourth active pattern ACT4, the 4ath source electrode SE4a and the 4bth source electrode SE4b are collectively referred to as a fourth source electrode SE4, and the 4ath drain electrode DE4a and the 4bth drain electrode DE4b are collectively referred to as the fourth drain electrode DE4.

The fourth gate electrode GE4 may be connected to the (i−1)th scan line Si−1. The fourth gate electrode GE4 may be provided as a portion of the (i−1)th scan line Si−1 or may be provided in a shape protruding from the (i−1)th scan line Si−1. For example, the 4ath gate electrode GE4a may be provided as a portion of the (i−1)th scan line Si−1. The 4bth gate electrode GE4b may be provided in a shape protruding from the (i−1)th scan line Si−1.

The fourth active pattern ACT4, the fourth source electrode SE4, and the fourth drain electrode DE4 may be formed of a semiconductor layer not doped or doped with impurities. For example, the fourth source electrode SE4 and the fourth drain electrode DE4 may be formed of a semiconductor layer doped with impurities, and the fourth active pattern ACT4 may be formed of a semiconductor layer not doped with impurities. The fourth active pattern ACT4 corresponds to a portion overlapping with the fourth gate electrode GE4.

One end of the fourth source electrode SE4 may be connected to the fourth active pattern ACT4. The other end of the fourth source electrode SE4 may be connected to an initialization power line IPL of a pixel PXL on an (i−1)th row and a seventh drain electrode DE7 of a seventh transistor T7 of the pixel PXL on the (i−1)th row. An auxiliary connection line AUX may be provided between the fourth source electrode SE4 and the initialization power line IPL. One end of the auxiliary connection line AUX may be connected to the fourth source electrode SE4 through a ninth contact hole CH9. The other end of the auxiliary connection line AUX may be connected to an initialization power line IPL on the (i−1)th row through an eighth contact hole CH8 of the pixel PXL on the (i−1)th row. One end of the fourth drain electrode DE4 may be connected to the fourth active pattern ACT4. The other end of the fourth drain electrode DE4 may be connected to the third drain electrode DE3 of the third transistor T3. Also, the fourth drain electrode DE4 may be connected to the first gate electrode GE1 of the first transistor T1 through the second contact hole CH2 and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the light emitting control line Ei. The fifth gate electrode GE5 may be provided as a portion of the light emitting control line Ei or may be provided in a shape protruding from the light emitting control line Ei. The fifth active pattern ACT, the fifth source electrode SE5, and the fifth drain electrode DE5 may be formed of a semiconductor layer not doped or doped with impurities. For example, the fifth source electrode SE5 and the fifth drain electrode DE5 may be formed of a semiconductor layer doped with impurities, and the fifth active pattern ACT5 may be formed of a semiconductor layer not doped with impurities. The fifth active pattern ACT5 corresponds to a portion overlapping with the fifth gate electrode GE5. One end of the fifth source electrode SE5 may be connected to the fifth active pattern ACT5. The other end of the fifth source electrode SE5 may be connected the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode SE6 may be connected to the light emitting control line Ei. The sixth gate electrode SE6 may be provided as a portion of the light emitting control line Ei or may be provided in a shape protruding from the light emitting control line Ei. The sixth active pattern ACT6, the sixth source electrode SE6, and the sixth drain electrode DE6 may be formed of a semiconductor layer not doped or doped with impurities. For example, the sixth source electrode SE6 and the sixth drain electrode DE6 may be formed of a semiconductor layer doped with impurities, and the sixth active pattern ACT6 may be formed of a semiconductor layer not doped with impurities. The sixth active pattern ACT6 corresponds to a portion overlapping with the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and a seventh drain electrode DE7.

The seventh gate electrode GE7 may be connected to the ith scan line Si. The seventh gate electrode GE7 may be provided as a portion of the ith scan line Si or may be provided in a shape protruding from the ith scan line Si. The seventh active pattern ACT7, the seventh source electrode SE7, and the seventh drain electrode DE7 may be formed of a semiconductor layer not doped or doped with impurities. For example, the seventh source electrode SE7 and the seventh drain electrode DE7 may be formed of a semiconductor layer doped with impurities, and the seventh active layer ACT7 may be formed of a semiconductor layer not doped with impurities. The seventh active pattern ACT7 corresponds to a portion overlapping with the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power line IPL. Also, the seventh drain electrode DE7 may be connected to a fourth source electrode SE4 of a fourth transistor T4 of a pixel PXL on an (i+1)th row. The seventh drain electrode DE7 may be connected to the fourth source electrode SE4 of the fourth transistor T4 of the pixel PXL on the (i+1)th row through the auxiliary connection line AUX, the eighth contact hole CH8, and the ninth contact hole CH9.

The storage capacitor Cst may include a lower electrode LE and an upper electrode UE. The lower electrode LE may be formed as the first gate electrode GE1 of the first transistor T1.

The upper electrode UE overlaps with the first gate electrode GE1, and may cover the lower electrode LE when viewed on a plane. As the overlapping area of the upper electrode UE and the lower electrode LE is widened, the capacitance of the storage capacitor Cst may be increased. The upper electrode UE may extend in the first direction DR1. In an embodiment of the present disclosure, a voltage having the same or substantially the same level as the first power source ELVDD may be applied to the upper electrode UE. The upper electrode UE may have an opening OPN in a region including the first contact hole CH1 through which the first gate electrode GE1 and the connection line CNL contact each other.

The organic light emitting device OLED may include a first electrode AD, a second electrode CD, and an emitting layer EML provided between the first electrode AD and the second electrode CD.

The first electrode AD may be provided in a light emitting region corresponding to each of the pixels PXL. The first electrode AD may be connected to the seventh source electrode SE7 of the seventh transistor T7 and the sixth drain electrode DE6 of the sixth transistor T6 through a seventh contact hole CH7, a tenth contact hole CH10, and a twelfth contact hole CH12. A first bridge pattern BRP1 may be provided between the seventh contact hole CH7 and the tenth contact hole CH10. A second bridge pattern BRP2 may be provided between the tenth contact hole CH10 and the twelfth contact hole CH12.

The first electrode AD may be electrically connected to the power line PL, to be supplied with the first power source (see ELVDD of FIGS. 2 and 3). The second electrode CD may be connected to the second power source (see ELVSS of FIGS. 2 and 3).

The first bridge pattern BRP1 and the second bridge pattern BRP2 may connect the sixth drain electrode DE6, the seventh source electrode SE7, and the first electrode AD.

Hereinafter, a structure of the display device according to the embodiment of the present disclosure will be described along a stacking order with reference to FIGS. 4 to 7.

The active pattern ACT1 to ACT7 (hereinafter, collectively referred to as ACT) may be provided on the substrate SUB. The active pattern ACT may include the first to seventh active patterns ACT1 to ACT7. The first to seventh active patterns ACT1 to ACT7 may include a semiconductor material.

A buffer layer may be provided between the substrate SUB and the first to seventh active patterns ACT1 to ACT7.

A gate insulating layer GI may be provided on the substrate SUB on which the active pattern ACT is formed. The gate insulating layer GI may include at least one of an organic insulating layer and an inorganic insulating layer. For example, the gate insulating layer GI may include the inorganic insulating layer, and the inorganic insulating layer may include at least one of silicon oxide ($SiO_x$), silicon nitride ($SiN_x$), and silicon oxynitride (SiON).

The (i−1)th scan line Si−1, the ith scan line Si, the light emitting control line Ei, and the first to seventh gate electrodes GE1 to GE7 may be provided on the gate insulating layer GI. The first gate electrode GE1 may be the lower electrode LE of the storage capacitor Cst. The second gate electrode GE2 and the third gate electrode GE3 may be integrally formed with the ith scan line Si. The fourth gate electrode GE4 may be integrally formed with the (i−1)th scan line Si−1. The fifth gate electrode GE5 and the sixth gate electrode GE6 may be integrally formed with the light emitting control line Ei. The seventh gate electrode GE7 may be integrally formed with the ith scan line Si.

A first interlayer insulating layer IL1 may be provided on the substrate SUB on which the (i−1)th scan line Si−1 and/or the like are formed. The first interlayer insulating layer IL1 may include at least one of an organic insulating layer and an inorganic insulating layer. For example, the first interlayer insulating layer IL1 may include the same or substantially the same material as the gate insulating layer GI.

The upper electrode UE of the storage capacitor Cst and the initialization power line IPL may be provided on the first interlayer insulating layer IL1. The upper electrode UE may cover the lower electrode LE. The upper electrode UE along with the lower electrode LE may constitute the storage capacitor Cst with the first interlayer insulating layer IL1 interposed therebetween.

A second interlayer insulating layer IL2 may be provided on the substrate SUB on which the upper electrode UE and the initialization power line IPL are disposed. The second interlayer insulating layer IL2 may include at least one of an organic insulating layer and an inorganic insulating layer.

The data line Dj, the connection line CNL, the auxiliary connection line AUX, the first bridge pattern BRP1, and a first conductive line PL1 of the power line PL may be provided on the second interlayer insulating layer IL2.

The data line Dj may be connected to the second source electrode SE2 through the sixth contact hole CH6 passing through the first interlayer insulating layer IL1, the second interlayer insulating layer IL2, and the gate insulating layer GI.

The connection line CNL may be connected to the first gate electrode GE1 through the first contact hole CH1 passing through the first interlayer insulating layer IL1 and the second interlayer insulating layer IL2. Also, the connection line CNL may be connected to the third drain electrode DE3 and the fourth drain electrode DE4 through the second contact hole CH2 passing through the gate insulating layer GI, the first interlayer insulating layer IL1, and the second interlayer insulating layer IL2.

The auxiliary connection line AUX may be connected to the initialization power line IPL through the eighth contact hole CH8 passing through the second interlayer insulating layer IL2. Also, the auxiliary connection line AUX may be connected to the fourth source electrode SE4 and the seventh drain electrode DE7 of the pixel PXL1 on the (i−1)th row through the ninth contact hole CH9 passing through the gate insulating layer GI, the first interlayer insulating layer IL1, and the second interlayer insulating layer IL2.

The first bridge pattern BRP1 may be a pattern provided as a medium connecting the sixth drain electrode DE6 to the first electrode AD between the sixth drain electrode DE6 and the first electrode AD. The first bridge pattern BRP1 may be connected to the sixth drain electrode DE6 and the first source electrode SE1 through the seventh contact hole CH7 passing through the gate insulating layer GI, the first interlayer insulating layer IL1, and the second interlayer insulating layer IL2.

The first conductive layer PL1 may be connected to the upper electrode UE of the storage capacitor Cst through the third contact hole CH3 and the fourth contact hole CH4, which pass through the second interlayer insulating layer IL2. The first conductive layer PL1 may be connected to the fifth source electrode SE5 through the fifth contact hole CH5 passing through the gate insulating layer GI, the first interlayer insulating layer IL1, and the second interlayer insulating layer IL2.

A third interlayer insulating layer IL3 may be provided on the substrate SUB on which the data line Dj and/or the like are formed. The third interlayer insulating layer IL3 may include at least one of an organic insulating layer and an inorganic insulating layer. For example, the third interlayer insulating layer IL3 may include a first sub-insulating layer IL31 including an inorganic insulating material, and a second sub-insulating layer IL32 disposed on the first sub-insulating layer IL31, the second sub-insulating layer IL32 including an organic insulating material.

The first sub-insulating layer IL31 may include at least one of silicon oxide, silicon nitride, silicon oxynitride, aluminum oxide ($AlO_x$), and hafnium oxide ($HfO_x$).

The second sub-insulating layer IL32 may include at least one of polyacrylate resin, epoxy resin, phenolic resin, polyamide resin, polyimide resin, unsaturated polyester resin, polyphenylene ether resin, polyphenylene sulfide resin, and benzocyclobutene resin.

A second conductive layer PL2 of power line PL and the second bridge pattern BRP2 may be provided on the third interlayer insulating layer IL3. The second bridge pattern BRP2 may be connected to the first bridge pattern BRP1 through the tenth contact hole CH10.

The second conductive layer PL2 overlaps with the first conductive layer PL1, and may be connected to the first conductive layer PL1 through an eleventh contact hole CH11 passing through the third interlayer insulating layer IL3. Thus, because the power line PL includes the first conductive layer PL1 and the second conductive layer PL2, and the first conductive layer PL1 and the second conductive layer PL2 are electrically connected to each other, it is possible to prevent or reduce a voltage drop of power supplied through the power line PL, e.g., the first power source ELVDD.

A protective layer PSV may be provided on the third interlayer insulating layer IL3 on which the power line PL and the second bridge pattern BRP2 are provided. The protective layer PSV may include at least one of an organic insulating layer and an inorganic insulating layer. For example, the protective layer PSV may include the organic insulating layer.

The organic light emitting device OLED may be provided on the protective layer PSV. The organic light emitting device OLED may include the first electrode AD, the second electrode CD, and the emitting layer EML provided between the first electrode AD and the second electrode CD.

The first electrode AD may be provided on the protective layer PSV. The first electrode AD may be connected to the second bridge pattern BRP2 through the twelfth contact hole CH12 passing through the protective layer PSV. Thus, the first electrode AD can be electrically connected to the first bridge pattern BRP1. Because the first bridge pattern BRP1 is connected to the sixth drain electrode DE6 and the seventh source electrode SE7 through the seventh contact hole CH7, the first electrode AD can be connected to the sixth drain electrode DE6 and the seventh source electrode SE7.

A pixel defining layer PDL defining a light emitting region to correspond to each of the pixels PXL may be provided on the substrate SUB on which the first electrode AD and/or the like are formed. The pixel defining layer PDL may expose a top surface of the first electrode AD therethrough and protrude from the substrate SUB along the circumference of the pixel PXL.

The emitting layer EML may be provided in the light emitting region surrounded by the pixel defining layer PDL, and the second electrode CD may be provided on the emitting layer EML. An encapsulation layer SLM covering the second electrode CD may be provided on the second electrode CD.

One of the first electrode AD and the second electrode CD may be an anode electrode, and the other of the first electrode AD and the second electrode CD may be a cathode electrode. For example, the first electrode AD may be an anode electrode, and the second electrode CD may be a cathode electrode.

In addition, at least one of the first electrode AD and the second electrode CD may be a transmissive electrode. For example, when the organic light emitting device OLED is a bottom-emission organic light emitting device, the first electrode AD may be a transmissive electrode, and the second electrode CD is a reflective electrode. When the organic light emitting device OLED is a top-emission organic light emitting device, the first electrode AD may be a reflective electrode, and the second electrode CD may be a transmissive electrode. When the organic light emitting device OLED is a dual-emission light emitting device, both of the first electrode AD and the second electrode CD may be transmissive electrodes. In the embodiment of FIGS. 4-7, a case in which the organic light emitting device OLED is a top-emission organic light emitting device, and the first electrode AD is an anode electrode is described as an example.

The first electrode AD may include a reflective layer capable of reflecting light and a transparent conductive layer disposed over or under the reflective layer. At least one of the transparent conductive layer and the reflective layer may be connected to the seventh source electrode SE7.

The reflective layer may include a material capable of reflecting light. For example, the reflective layer may include at least one selected from the group consisting of aluminum (Al), silver (Ag), chromium (Cr), molybdenum (Mo), platinum (Pt), nickel (Ni), and alloys thereof.

The transparent conductive layer may include a transparent conductive oxide. For example, the transparent conductive layer may include at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be disposed on the exposed surface of the first electrode AD. The emitting layer EML may have a multi-layered thin film structure at least including a light generation layer (LGL). For example, the emitting layer EML may include a hole injection layer (HIL) for injecting holes, a hole transport layer (HTL) having an excellent hole transporting property (the HTL being for increasing the opportunity for holes and electrons to be re-combined by suppressing the movement of electrons that fail to be combined in the LGL, the LGL being for emitting light through the re-combination of the injected electrons and holes) a hole blocking layer (HBL) for suppressing the movement of holes that fail to be combined in the LGL, an electron transport layer (ETL) smoothly transporting electrons to the LGL, and an electron injection layer (EIL) for injecting electrons. In the emitting layer EML, the HIL, HTL, HBL, ETL, and EIL may be common layers commonly disposed in pixels PXL adjacent to each other.

The color of light generated in the LGL may be one of red, green, blue, and white, but this embodiment is not limited thereto. For example, the color of light generated in the LGL may also be one of magenta, cyan, and yellow.

The second electrode CD may be a semi-transmissive reflective layer. For example, the second electrode CD may be a thin metal layer having a thickness, through which light emitted through the emitting layer EML can be transmitted. The second electrode CD may transmit a portion of the light emitted from the emitting layer EML therethrough, and may reflect the rest of the light emitted from the emitting layer EML.

The second electrode CD may include a material having a lower work function than the transparent conductive layer. For example, the second electrode CD may be include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof.

A portion of the light emitted from the emitting layer EML may not be transmitted through the second electrode CD, and the light reflected from the second electrode CD may be again reflected from the reflective layer. That is, the light emitted from the emitting layer EML may resonate between the reflective layer and the second electrode CD. The light extraction efficiency of the organic light emitting device OLED can be improved by the resonance of the light.

The distance between the reflective layer and the second electrode CD may be changed depending on a color of the light emitted from the emitting layer EML. That is, the distance between the reflective layer and the second electrode CD may be adjusted to correspond to a resonance distance, depending on a color of the light emitted from the emitting layer EML.

In an embodiment of the present disclosure, the third interlayer insulating layer IL3 may include a concave part CCP provided in a region in which the second conductive layer PL2 and the first electrode AD overlap with each other, and the second conductive layer PL2 may be disposed in the concave part CCP. The concave part CCP may be a region in a portion of the third interlayer insulating layer IL3 is removed. For example, the concave part CCP may be an opening of the second sub-insulating layer IL32, through which the first sub-insulating layer IL31 is exposed, in the region in which the second conductive layer PL2 and the first electrode AD overlap with each other.

In an embodiment of the present disclosure, the second conductive layer PL2 may be disposed on the first sub-insulating layer IL31. Therefore, a distance between the second conductive layer PL2 and the first electrode AD may increase in the region in which the second conductive layer PL2 and the first electrode AD overlap with each other. When the distance between the second conductive layer PL2 and the first electrode AD increases, a thickness of the protective layer PSV may increase. That is, in the protective layer PSV, a thickness of a region corresponding to the concave part CCP may be greater than that of the other region.

The protective layer PSV may include an organic insulating layer. As a thickness of the organic insulating layer increases, the organic insulating layer may have a planarized surface by removing a step difference of a lower structure thereof. Therefore, an interface between the protective layer PSV and the first electrode AD may be a flat surface.

Because a surface of the first electrode AD is influenced by a lower layer of the first electrode AD, i.e., a surface of the protective layer PSV, the surface of the first electrode AD may have a planarized shape. When the surface of the first electrode AD has the planarized shape, the display device including the organic light emitting device OLED can prevent or reduce white angle dependency (WAD) caused by surface non-uniformity of the first electrode AD.

The encapsulation layer SLM can prevent or reduce oxygen and moisture from infiltrating into the organic light emitting device OLED. The encapsulation layer SLM may include a plurality of inorganic layers and a plurality of organic layers. For example, the encapsulation layer SLM may include a plurality of encapsulation layers) including the inorganic layer and the organic layer disposed on the inorganic layer). In addition, the inorganic layer may be disposed at the uppermost portion of the encapsulation layer SLM. The inorganic layer may include at least one selected from the group consisting of silicon oxide, silicon nitride, silicon oxynitride, aluminum oxide, titanium oxide, zirconium oxide, and tin oxide, and combinations thereof.

Figure 8:
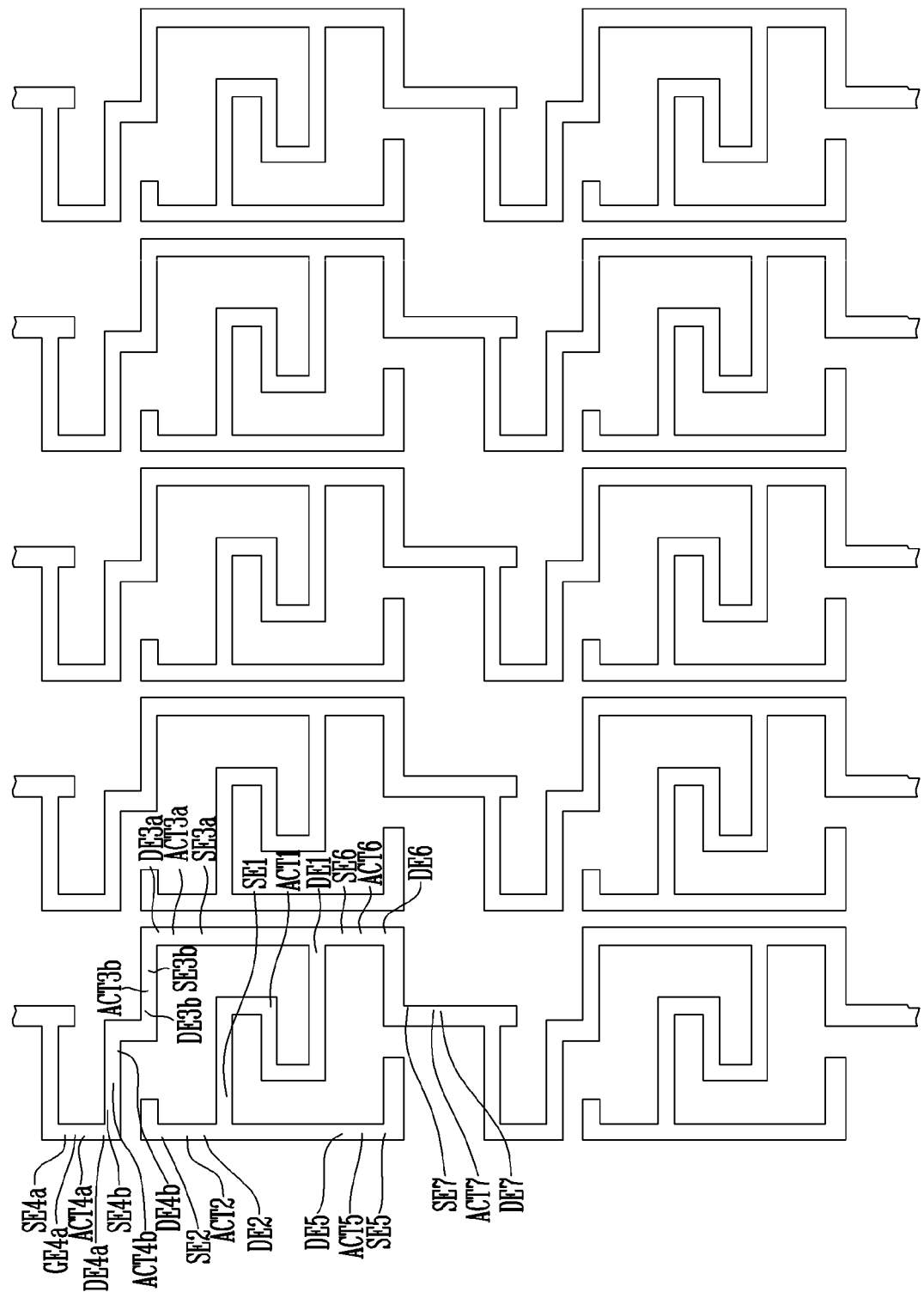
FIG. 8 is a plan view illustrating active patterns shown in FIGS. 2 to 7.
Figure 9:
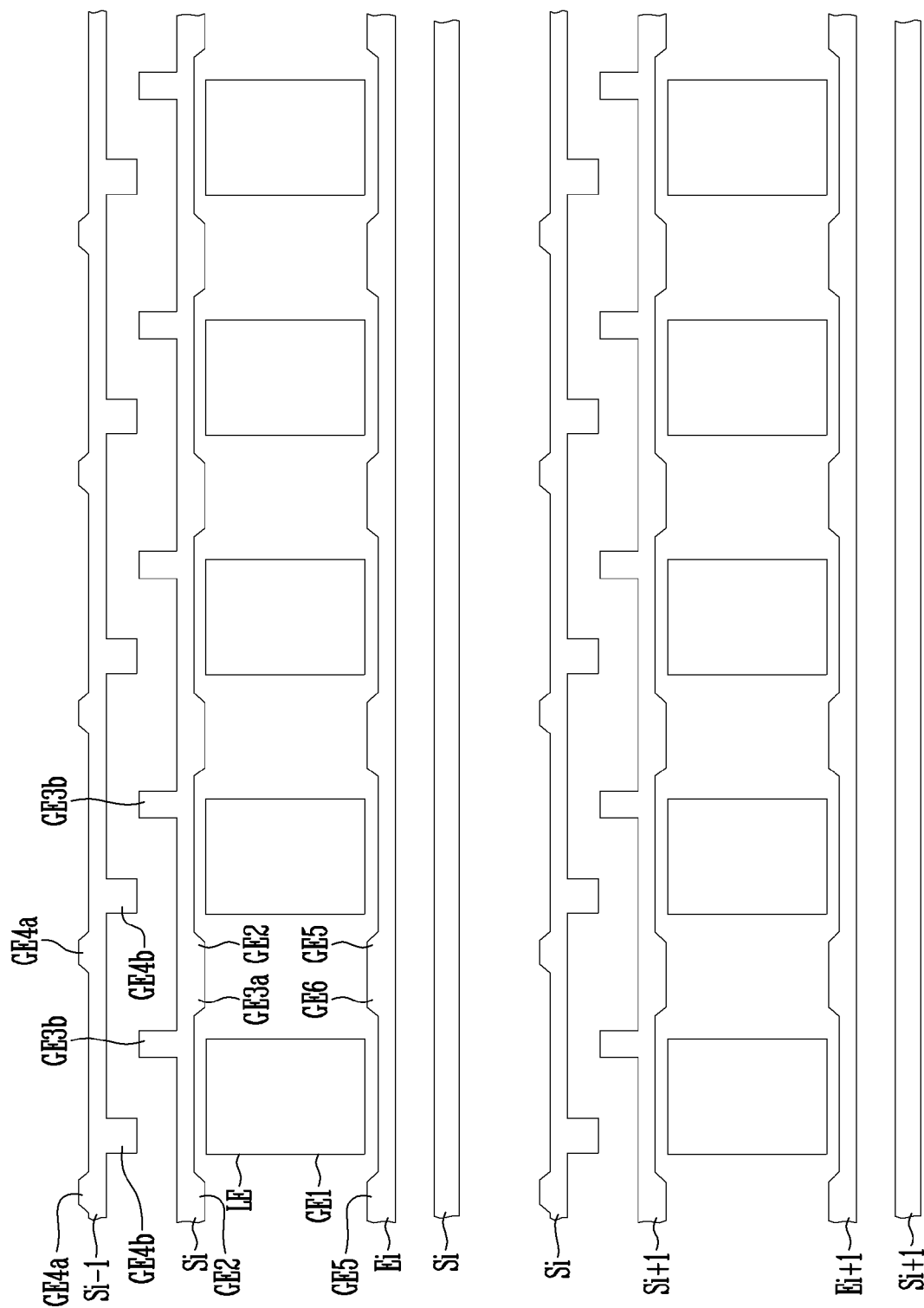
FIG. 9 is a plan view illustrating scan lines, light emitting control lines, and a lower electrode of a storage capacitor, which are shown in FIGS. 2 to 7.
Figure 10:
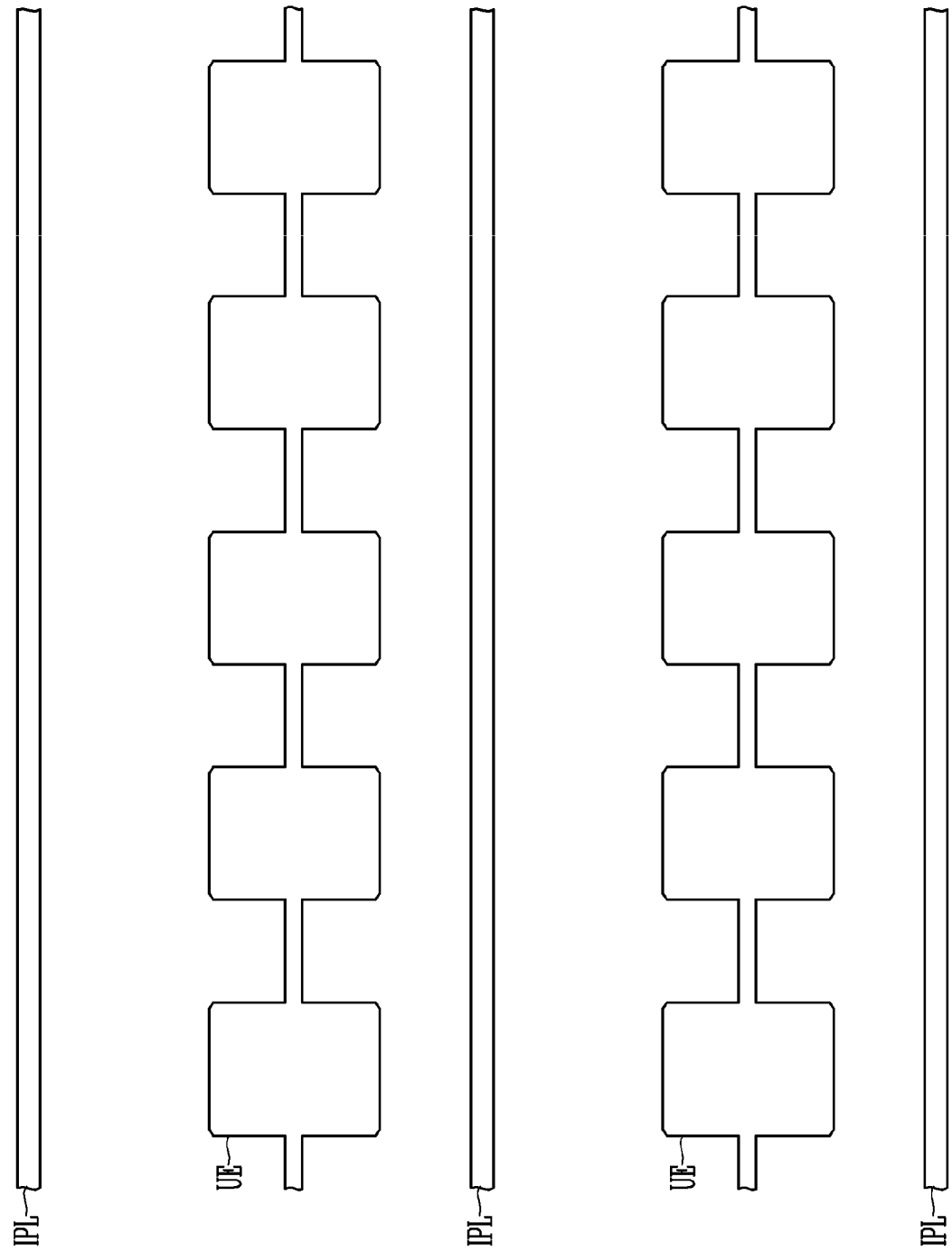
FIG. 10 is a plan view illustrating an initialization power line and an upper electrode of the storage capacitor, which are shown in FIGS. 2 to 7.
Figure 11:
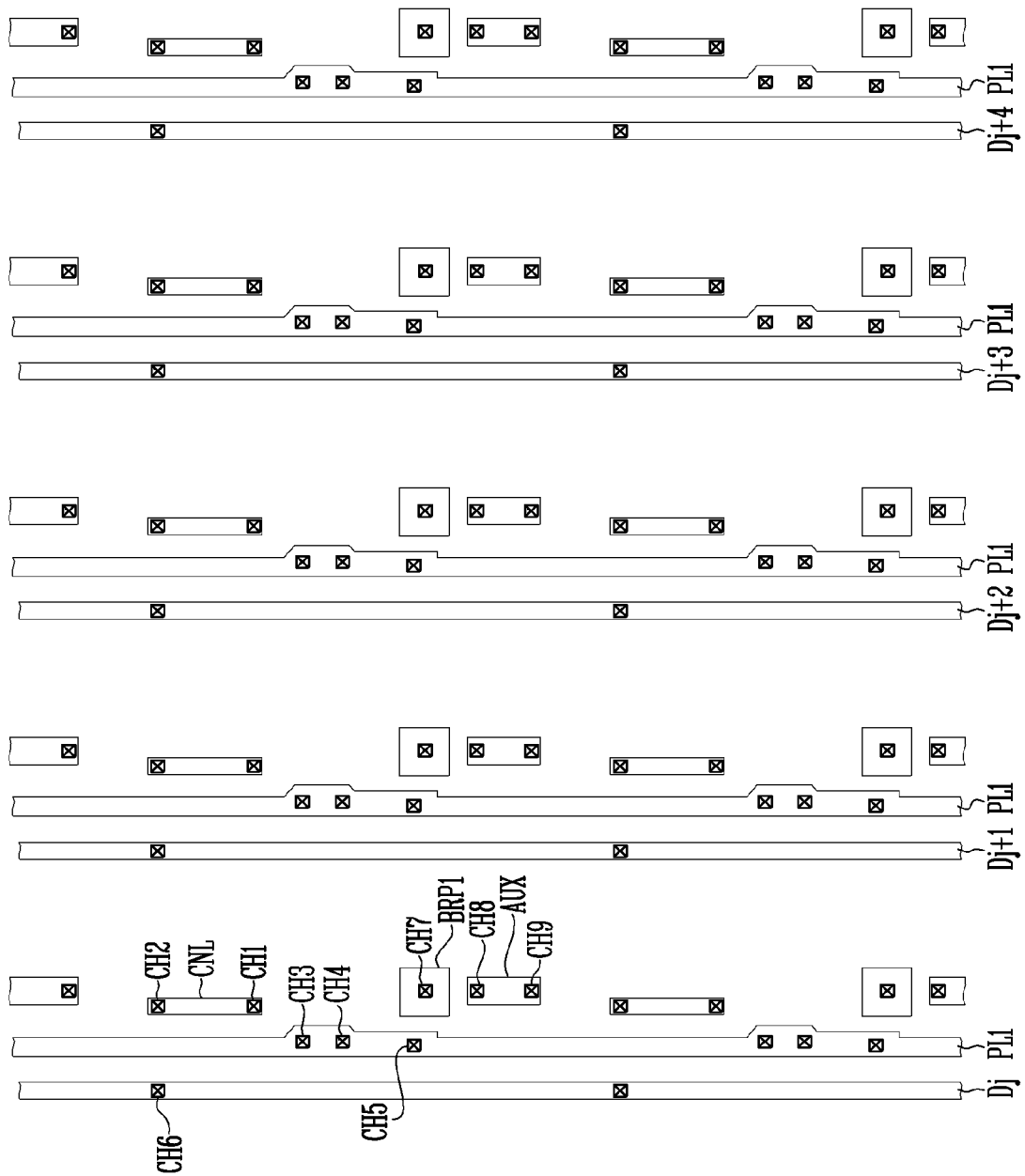
FIG. 11 is a plan view illustrating data lines, a connection line, an auxiliary connection line, a first conductive layer of a power line, and a first bridge pattern, which are shown in FIGS. 2 to 7.
Figure 12:
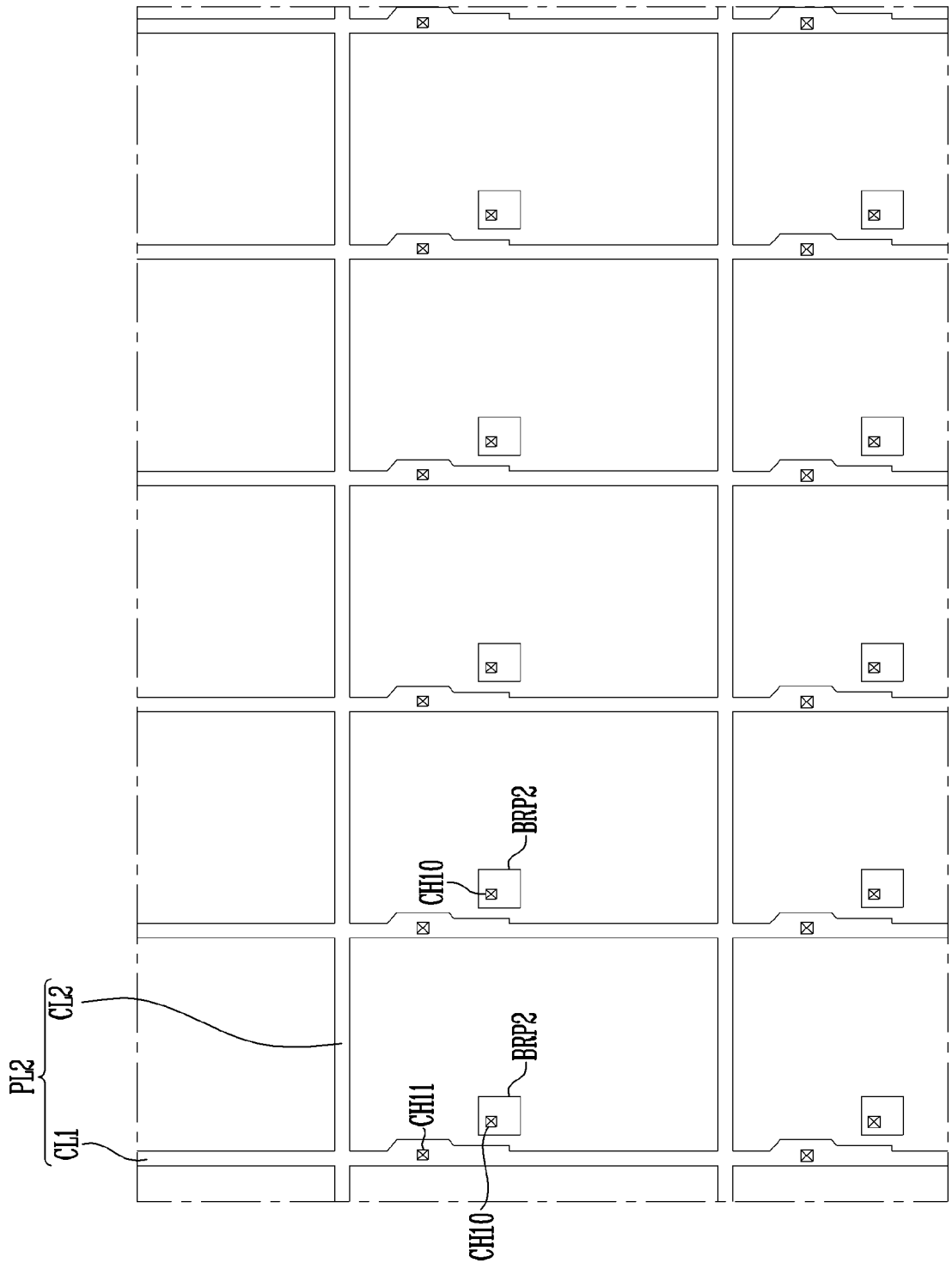
FIG. 12 is a plan view illustrating a second conductive layer of the power line and a second bridge pattern, which are shown in FIGS. 2 to 7.
Figure 13:
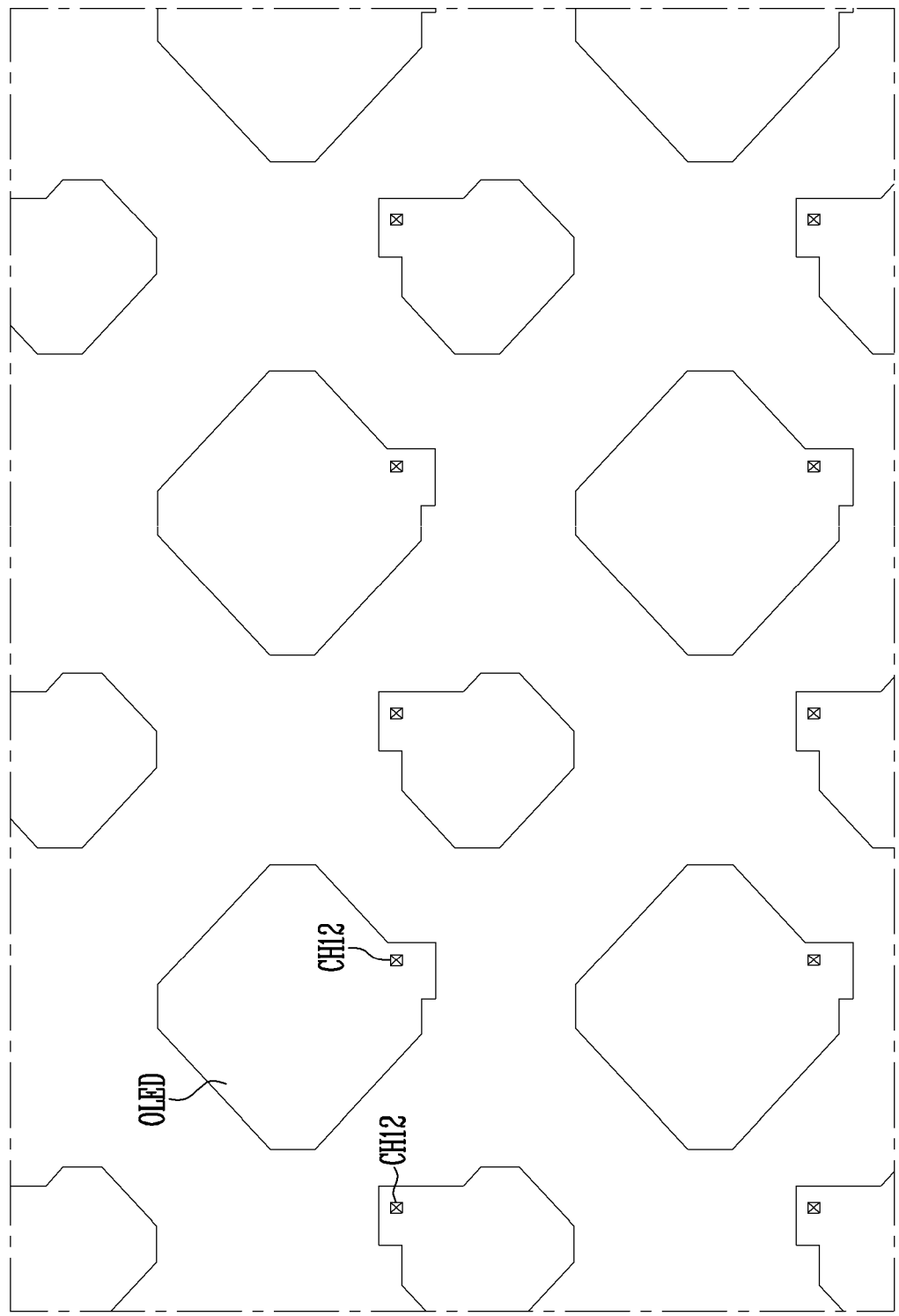
FIG. 13 is a plan view illustrating an organic light emitting device shown in FIGS. 2 to 7.
Figure 14:
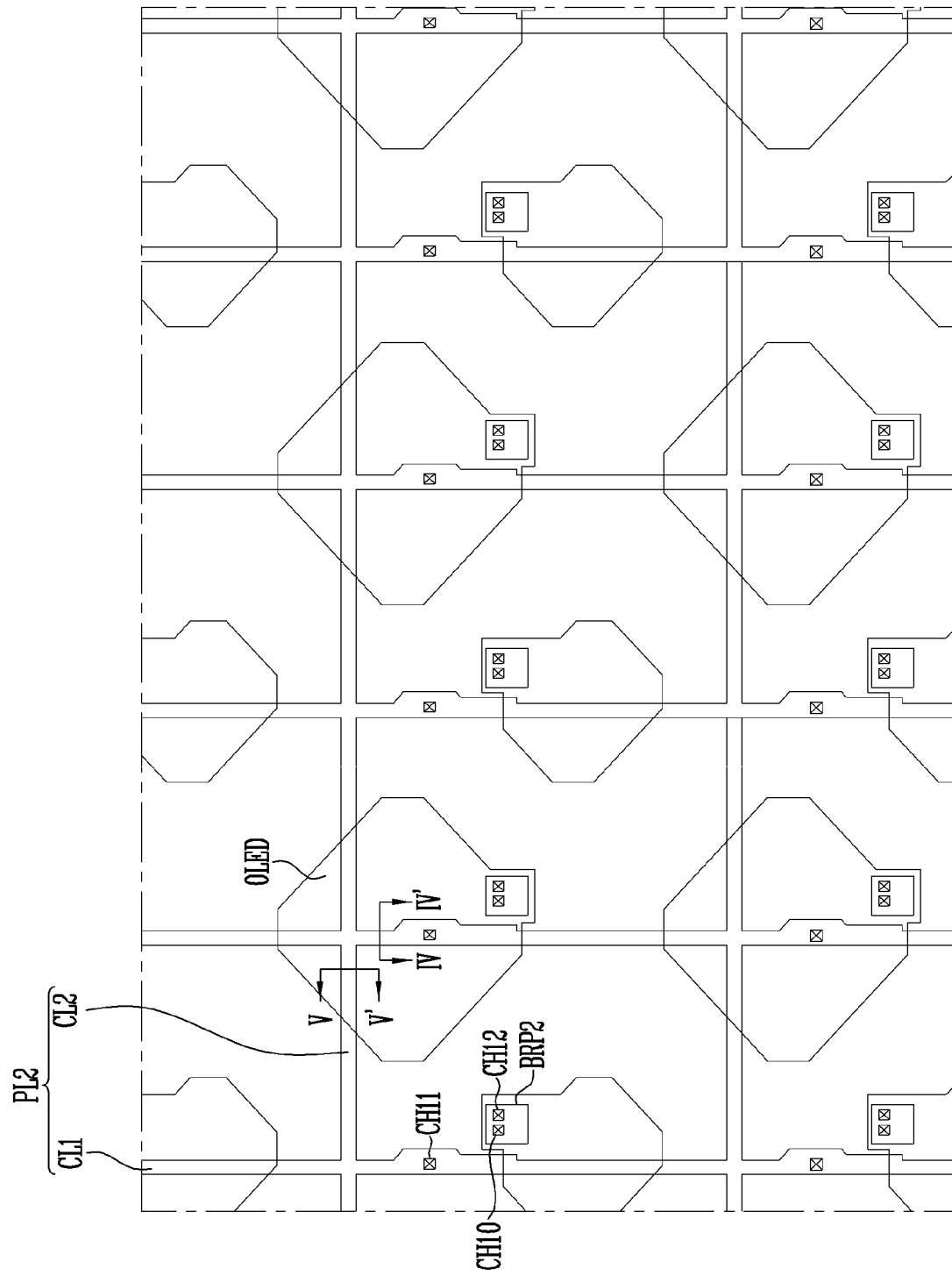
FIG. 14 is a plan view illustrating the second conductive layer of the power line, the second bridge pattern, and the organic light emitting device, which are shown in FIGS. 12 and 13.
Figure 15:
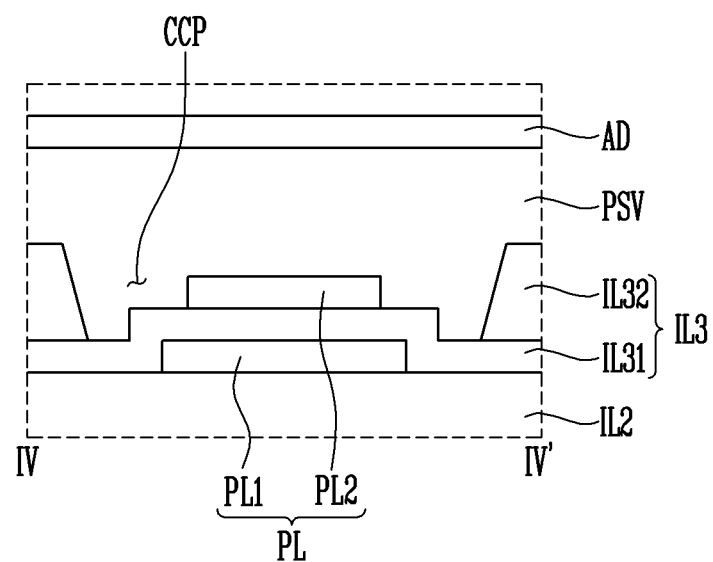
FIG. 15 is a sectional view taken along line IV-IV' of FIG. 14.
Figure 16:
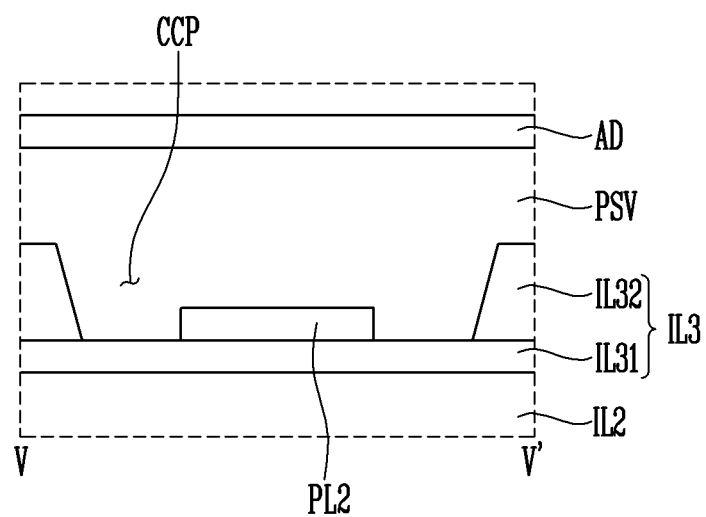
FIG. 16 is a sectional view taken along line V-V of FIG. 14.

FIG. 8 is a plan view illustrating active patterns shown in FIGS. 2 to 7. FIG. 9 is a plan view illustrating scan lines, light emitting control lines, and a lower electrode of a storage capacitor, which are shown in FIGS. 2 to 7. FIG. 10 is a plan view illustrating an initialization power line and an upper electrode of the storage capacitor, which are shown in FIGS. 2 to 7. FIG. 11 is a plan view illustrating data lines, a connection line, an auxiliary connection line, a first conductive layer of a power line, and a first bridge pattern, which are shown in FIGS. 2 to 7. FIG. 12 is a plan view illustrating a second conductive layer of the power line and a second bridge pattern, which are shown in FIGS. 2 to 7. FIG. 13 is a plan view illustrating an organic light emitting device shown in FIGS. 2 to 7. FIG. 14 is a plan view illustrating the second conductive layer of the power line, the second bridge pattern, and the organic light emitting device, which are shown in FIGS. 12 and 13. FIG. 15 is a sectional view taken along line IV-IV' of FIG. 14. FIG. 16 is a sectional view taken along line V-V of FIG. 14. In FIGS. 7 to 13, for convenience of illustration, components of pixels on an ith pixel row and an (i+1)th pixel row are illustrated for each of the layers. In FIGS. 15 and 16, a second interlayer insulating layer, a third interlayer insulating layer, a first conductive layer, a second conductive layer, and a first electrode are illustrated for convenience of description.

Referring to FIGS. 2 to 16, first to seventh active patterns ACT1 to ACT7 may be provided on a substrate SUB. The first to seventh active patterns ACT1 to ACT7 may be formed in the same layer through the same process.

One end of the first active pattern ACT1 may be connected to a first source electrode SE1, and the other end of the first active pattern ACT1 may be connected to a first drain electrode DE1. One end of the second active pattern ACT2 may be connected to a second source electrode SE2, and the other end of the second active pattern ACT2 may be connected to a second drain electrode DE2. One end of the third active pattern ACT3 may be connected to a third source electrode SE3, and the other end of the third active pattern ACT3 may be connected to a third drain electrode DE3. One end of the fourth active pattern ACT4 may be connected to a fourth source electrode SE4, and the other end of the fourth active pattern ACT4 may be connected to a fourth drain electrode DE4. One end of the fifth active pattern ACT5 may be connected to a source electrode SE5, and the other end of the fifth active pattern ACT5 may be connected to the fifth drain electrode DE5. One end of the sixth active pattern ACT6 may be connected to a sixth source electrode SE6, and the other end of the sixth active pattern ACT6 may be connected to a sixth drain electrode DE5. One end of the seventh active pattern ACT7 may be connected to a seventh source electrode SE7, and the other end of the seventh active pattern ACT7 may be connected to a seventh drain electrode DE7.

Scan lines Si−1, Si, and Si+1, light emitting control lines Ei and Ei+1, and a lower electrode LE of a storage capacitor may be provided on a gate insulating layer GI disposed over the first to seventh active patterns ACT1 to ACT7. The scan lines Si−1, Si, and Si+1, the light emitting control lines Ei and Ei+1, and the lower electrode LE of the storage capacitor may be formed in the same layer through the same process.

The scan lines Si−1, Si, and Si+1 may include an (i−1)th scan line Si−1, an ith scan line Si, and an (i+1)th scan line Si+1.

On an ith pixel row, a first gate electrode GE1 is connected to (e.g., provided to or part of) the lower electrode LE, and a fourth gate electrode GE4 is connected to (e.g., provided to or part of) the (i−1)th scan line Si−1. A second gate electrode GE2, a third gate electrode GE3, and a seventh gate electrode GE7 may be connected to (e.g., provided to or part of) the ith scan line Si. A fifth gate electrode GE5 and a sixth gate electrode GE6 may be connected to (e.g., provided to or part of) the light emitting control line Ei.

On an (i+1)th pixel row, a first gate electrode GE1 is connected to (e.g., provided to or part of) the lower electrode LE, and a fourth gate electrode GE4 is connected to (e.g., provided to or part of) the ith scan line Si. A second gate electrode GE2, a third gate electrode GE3, and a seventh gate electrode GE7 may be connected to (e.g., provided to or part of) the (i+1)th scan line Si+1. A fifth gate electrode GE5 and a sixth gate electrode GE6 may be connected to (e.g., provided to or part of) the light emitting control line Ei+1.

An initialization power line IPL and an upper electrode UE of the storage capacitor may be provided on a first interlayer insulating layer IL1 disposed over the scan lines Si−1, Si, and Si+1, the light emitting control line Ei and Ei+1, and the lower electrode LE. The initialization power line IPL and the upper electrode UE may be formed in the same layer through the same process.

Data lines Dj, Dj+1, Dj+2, Dj+3, or Dj+4, a first conductive layer PL1 of a power line PL, an auxiliary connection line AUX, a connection line CNL, and a first bridge pattern BRP1 may be provided on a second interlayer insulating layer IL2 disposed over the initialization power line IPL and the upper electrode UE. The data lines Dj, Dj+1, Dj+2, Dj+3, or Dj+4, the first conductive layer PL1, the auxiliary connection line AUX, the connection line CNL, and the first bridge pattern BRP1 may be formed in the same layer through the same process.

The data lines Dj, Dj+1, Dj+2, Dj+3, and Dj+4 may be connected to the second source electrode SE through a sixth contact hole CH6 passing through the gate insulating layer GI, the first interlayer insulating layer IL1, and the second interlayer insulating layer IL2.

The first conductive layer PL1 may extend in parallel to at least one of the data lines Dj, Dj+1, Dj+2, Dj+3, and Dj+4 and the scan lines Si−1, Si, and Si+1, e.g., the data line Dj, Dj+1, Dj+2, Dj+3, or Dj+4. The first conductive layer PL1 may be connected to the upper electrode UE through a third contact hole CH3 and a fourth contact hole CH4, which pass through the second interlayer insulating layer IL2. Also, the first conductive layer PL1 may be connected to the fifth source electrode SE5 through a fifth contact hole CH5 passing through the gate insulating layer GI, the first interlayer insulating layer IL1, and the second interlayer insulating layer IL2.

The connection line CNL may be connected to the first gate electrode GE through a first contact hole CH1 passing through the first interlayer insulating layer IL1 and the second interlayer insulating layer IL2.

The auxiliary connection line AUX may be connected to the initialization power line IPL through an eighth contact hole CH8 passing through the second interlayer insulating layer IL2. Also, the auxiliary connection line AUX may be connected to the seventh drain electrode DE7 through a ninth contact hole CH9 passing through the gate insulating layer GI, the first interlayer insulating layer IL1, and the second interlayer insulating layer IL2.

The first bridge pattern BRP1 may be connected to the seventh drain electrode DE6 and the seventh source electrode SE7 through a seventh contact hole CH7 passing through the gate insulating layer GI, the first interlayer insulating layer IL1, and the second interlayer insulating layer IL2.

A second bridge pattern BRP2 and a second conductive layer PL2 of the power line PL may be provided on a third interlayer insulating layer IL3 disposed over the data line Dj, the power line PL, the auxiliary connection line AUX, the connection line CNL, and the first bridge pattern BRP1. The second bridge pattern BRP2 and the second conductive layer PL2 may be formed in the same layer through the same process.

The second bridge pattern BRP2 may be connected to the first bridge pattern BRP1 through a tenth contact hole CH10.

The second conductive layer PL2 may include a plurality of first conductive lines CL1 and a plurality of second conductive lines CL2 crossing the first conductive lines CL1.

One of the first conductive lines CL1 and the second conductive lines CL2, e.g., the first conductive lines CL1 may extend in a direction parallel to one of the data lines Dj, Dj+1, Dj+2, Dj+3, and Dj+4 and the scan lines Si−1, Si, and Si+1, e.g., the data lines Dj, Dj+1, Dj+2, Dj+3, and Dj+4. The first conductive lines CL1 overlaps with the first conductive layer PL1 in parallel to the first conductive layer PL1, and may be connected to the first conductive layer PL1 through an eleventh contact hole CH11 passing through the third interlayer insulating layer IL3. Thus, because the power line PL includes the first conductive layer PL1 and the second conductive layer PL2, and the first conductive layer PL1 and the second conductive layer PL2 are electrically connected to each other, it is possible to prevent or reduce a voltage drop of power supplied through the power line PL, e.g., the first power source ELVDD.

The other of the first conductive lines CL1 and the second conductive lines CL2, e.g., the second conductive lines CL2 may be parallel to the other of the data lines Dj, Dj+1, Dj+2, Dj+3, and Dj+4 and the scan lines Si−1, Si, and Si+1, e.g., the scan lines Si−1, Si, and Si+1.

In this embodiment, a case in which the second conductive lines CL2 extend in a direction parallel to the scan lines Si−1, Si, and Si+1 has been illustrated as an example, but the present disclosure is not limited thereto. For example, the second conductive lines CL2 may extend in a direction inclined to the scan lines Si−1, Si, and Si+1.

A protective layer PSV may be provided on the third interlayer insulating layer IL3 on which the second conductive layer PL2 and the second bridge pattern BRP2. The protective layer PSV may include at least one of an organic insulating layer and an inorganic insulating layer. For example, the protective layer PSV may include the organic insulating layer.

Organic light emitting devices OLED may be provided on the protective layer PSV. Each of the organic light emitting devices OLED may include a first electrode AD disposed on the protective layer PSV, an emitting layer EML disposed on the first electrode AD, and a second electrode CD disposed on the emitting layer EML.

The first electrode AD may be connected to the second bridge pattern BRP2 through a twelfth contact hole CH12 passing through the protective layer PSV.

When the first conductive lines CL1 and the second conductive lines CL2 of the second conductive layer PL2 overlap with the organic light emitting devices OLED, step differences may be generated at lower portions of the organic light emitting devices OLED by the second conductive layer PL2. A surface of the protective layer PSV may have irregularity. The irregularity of the surface of the protective layer PSV may cause irregularity of a surface of the first electrode AD provided on the protective layer PSV. If the surface of the first electrode AD has the irregularity, surfaces of the organic light emitting devices OLED, from which light is emitted, may have irregularity. If the surfaces of the organic light emitting devices OLED, from which light is emitted, have irregularity, light emitted from the organic light emitting devices OLED is not uniformly emitted according to directions thereof. Therefore, WAD according to viewing angles of a display device including the organic light emitting devices OLED may occur.

However, in an embodiment of the present disclosure, the display device including the organic light emitting devices OLED may prevent or reduce WAD according viewing angles thereof.

This will be described in more detail. The third interlayer insulating layer IL3 includes a concave part CCP provided in a region in which the second conductive layer PL2 and the first electrode AD overlap with each other, and the second conductive layer PL2 may be disposed in the concave part CCP. The concave part CCP may be a region in which a portion of the third interlayer insulating layer IL3 is removed. For example, the concave part CCP may be an opening of a second sub-insulating layer IL32, through which a first sub-insulating layer IL31 is exposed, in the region in which the second conductive layer PL2 and the first electrode AD overlap with each other.

The second conductive layer PL2 may be disposed on the first sub-insulating layer IL31. Therefore, a distance between the second conductive layer PL2 and the first electrode AD may increase in the region in which the second conductive layer PL2 and the first electrode AD overlap with each other. When the distance between the second conductive layer PL2 and the first electrode AD increases in the region in which the second conductive layer PL2 and the first electrode AD overlap with each other, a thickness of the protective layer PSV may increase. The protective layer PSV may include an organic insulating layer. As a thickness of the organic insulating layer increases, the organic insulating layer may have a planarized surface by removing a step difference of a lower structure thereof. Therefore, an interface between the protective layer PSV and the first electrode AD may be a flat surface.

Because a surface of the first electrode AD is influenced by a lower layer of the first electrode AD, i.e., a surface of the protective layer PSV, the surface of the first electrode AD may have a planarized shape. When the surface of the first electrode AD has the planarized shape, the display device including the organic light emitting device OLED can prevent or reduce WAD caused by surface non-uniformity of the first electrode AD.

Hereinafter, display devices according to other embodiments of the present disclosure will be described with reference to FIGS. 17 to 20. In FIGS. 17 to 20, components like those illustrated in FIGS. 1 to 16 are designated by like reference numerals, and may be briefly described. Also, in FIGS. 17 to 20, differences from FIGS. 1 to 16 may be mainly described to avoid redundancy.

Figure 17:
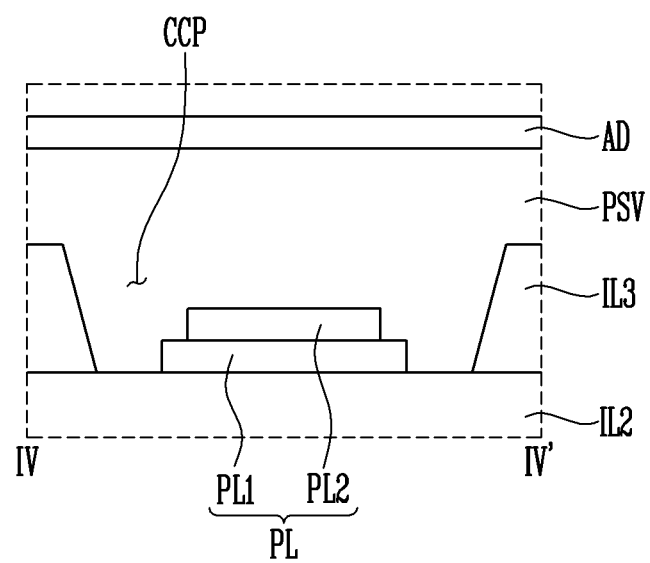
FIGS. 17 and 18 are views illustrating a display device according to another embodiment of the present disclosure.
Figure 18:
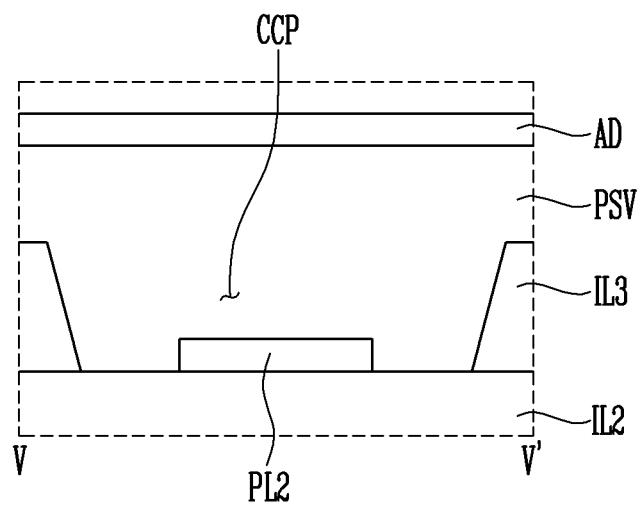

FIGS. 17 and 18 are views illustrating a display device according to another embodiment of the present disclosure. FIG. 17 is a sectional view taken along line IV-IV' of FIG. 14, and FIG. 18 is a sectional view taken along line V-V of FIG. 14. In FIGS. 17 and 18, a second interlayer insulating layer, a third interlayer insulating layer, a first conductive layer, a second conductive layer, and a first electrode are illustrated for convenience of description.

Referring to FIGS. 2 to 14, 17, and 18, an active pattern ACT1 to ACT7 (hereinafter, referred to as ACT) may be provided on a substrate SUB. The active pattern ACT may include first to seventh active patterns ACT1 to ACT7. The first to seventh active patterns ACT1 to ACT7 may include a semiconductor material.

A gate insulating layer GI may be provided on the substrate SUB on which the active pattern ACT is formed.

An (i–1)th scan line Si–1, an ith scan line Si, a light emitting control line Ei, and first to seventh gate electrodes GE1 to GE7 may be provided on the gate insulating layer GI. The first gate electrode GE1 may become a lower electrode LE of a storage capacitor Cst.

A first interlayer insulating layer IL1 may be provided on the substrate SUB on which the (i–1)th scan line Si–1 and/or the like are formed.

An upper electrode UE of the storage capacitor Cst and an initialization power line IPL may be provided on the first interlayer insulating layer IL1.

A second interlayer insulating layer IL2 may be provided on the substrate SUB on which the upper electrode UE and the initialization power line IPL are disposed.

A data line Dj, a connection line CNL, an auxiliary connection line AUX, a first bridge pattern BRP1, and a first conductive layer PL1 of a power line PL may be provided on the second interlayer insulating layer IL2.

A third interlayer insulating layer IL3 may be provided on the substrate SUB on which the data line Dj and/or the like are formed. The third interlayer insulating layer IL3 may include at least one of an organic insulating layer and an inorganic insulating layer. For example, the third interlayer insulating layer IL3 may be an organic insulating layer including an organic insulating material.

A second bridge pattern BRP2 and a second conductive layer PL2 of the power line PL may be provided on the third interlayer insulating layer IL3. The second conductive layer PL2 may include a plurality of first conductive lines CL1 and a plurality of second conductive lines CL2 crossing the first conductive lines CL1. One of the first conductive lines CL1 and the second conductive lines CL2 overlap with the first conductive layer PL1, and may be electrically connected to the first conductive layer PL1.

A protective layer PSV may be provided on the third interlayer insulating layer IL3 on which the second conductive layer PL2 and the second bridge pattern BRP2 are provided.

An organic light emitting device OLED may be provided on the protective layer PSV. The organic light emitting device OLED may include a first electrode AD, a second electrode CD, and an emitting layer EML provided between the first electrode AD and the second electrode CD.

An encapsulation layer SLM that isolates the organic light emitting device OLED from an external environment may be provided over the organic light emitting device OLED.

In an embodiment of the present disclosure, the third interlayer insulating layer IL3 may include a concave part CCP provided in a region in which the second conductive layer PL2 and the first electrode AD overlap with each other, and the second conductive layer PL2 may be disposed in the concave part CCP. The concave part CCP may be a region in a portion of the third interlayer insulating layer IL3 is removed. For example, the concave part CCP may be an opening of the third interlayer insulating layer IL3, through which the first conductive layer PL1 and the second interlayer insulating layer IL2 are exposed, in the region in which the second conductive layer PL2 and the first electrode AD overlap with each other. This will be described in more detail. In the region in which the second conductive layer PL2 and the first electrode AD overlap with each other, the concave part CCP may expose at least the first conductive layer PL1 therethrough. Also, in the region in which the second conductive layer PL2 and the first electrode AD overlap with each other, the concave part CCP may be an opening through which the second interlayer insulating layer IL2 is exposed. Therefore, in the concave part CCP, the first conductive lines CL1 of the second conductive layer PL2 are disposed on the first conductive layer PL1, and may be in direct contact with the first conductive layer PL1. In addition, the second conductive lines CL2 of the second conductive layer PL2 may be disposed on the second interlayer insulating layer IL2. Here, because the first conductive lines CL1 and the first conductive layer PL1 are in direct contact with each other, an eleventh contact hole CH11 through which the first conductive layer PL1 is electrically connected to the second conductive layer PL2 may be omitted.

As described above, in the region in which the second conductive layer PL2 and the first electrode AD overlap with each other, the first conductive lines CL1 may be disposed on the first conductive layer PL1, and the second conductive lines CL2 may be disposed on the second interlayer insulating layer IL2. Therefore, a distance between the second conductive layer PL2 and the first electrode AD may increase in the region in which the second conductive layer PL2 and the first electrode AD overlap with each other. When the distance between the second conductive layer PL2 and the first electrode AD increases, a thickness of the protective layer PSV may increase. The protective layer PSV may include an organic insulating layer. As a thickness of the organic insulating layer increases, the organic insulating layer may have a planarized surface by removing a step difference of a lower structure thereof.

Because a surface of the first electrode AD is influenced by a lower layer of the first electrode AD, i.e., a surface of the protective layer PSV, the surface of the first electrode AD may have a planarized shape. When the surface of the first electrode AD has the planarized shape, the display device including the organic light emitting device OLED can prevent or reduce WAD caused by surface non-uniformity of the first electrode AD.

Figure 19:
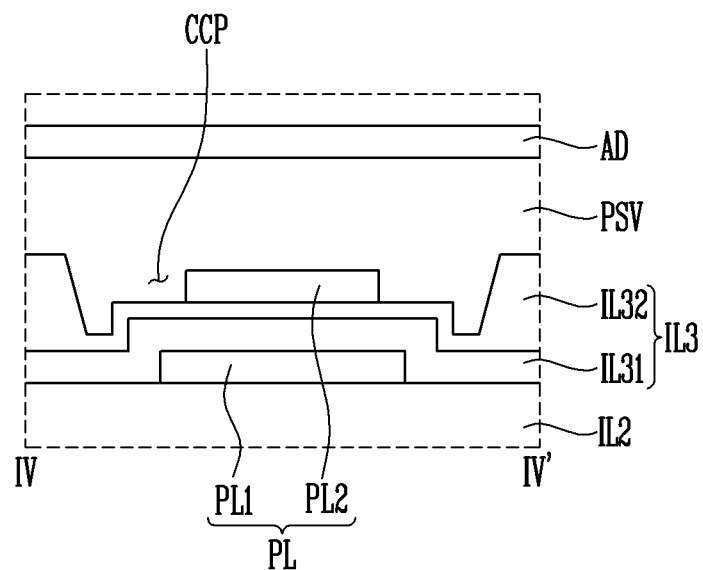
FIGS. 19 and 20 are views illustrating a display device according to still another embodiment of the present disclosure.
Figure 20:
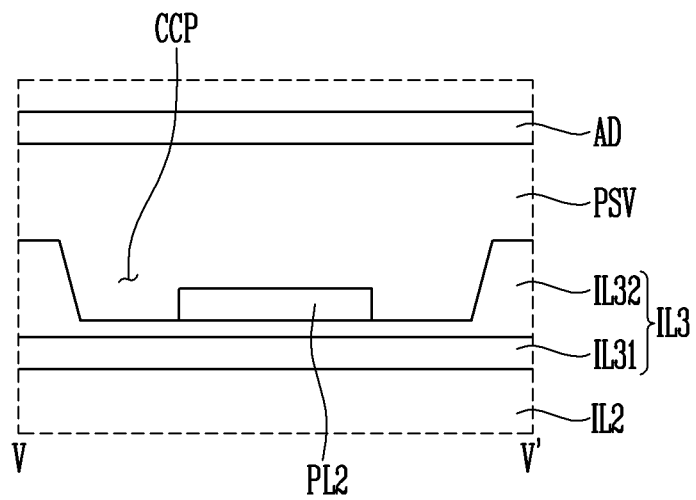

FIGS. 19 and 20 are views illustrating a display device according to still another embodiment of the present disclosure. FIG. 19 is a sectional view taken along line IV-IV' of FIG. 14, and FIG. 20 is a sectional view taken along line V-V of FIG. 14. In FIGS. 19 and 20, a second interlayer insulating layer, a third interlayer insulating layer, a first conductive layer, a second conductive layer, and a first electrode are illustrated for convenience of description.

Referring to FIGS. 2 to 14, 19, and 20, an active pattern ACT1 to ACT7 (hereinafter, referred to as ACT) may be provided on a substrate SUB. The active pattern ACT may include first to seventh active patterns ACT1 to ACT7. The first to seventh active patterns ACT1 to ACT7 may include a semiconductor material.

A gate insulating layer GI may be provided on the substrate SUB on which the active pattern ACT is formed.

An (i-1)th scan line Si-1, an ith scan line Si, a light emitting control line Ei, and first to seventh gate electrodes GE1 to GE7 may be provided on the gate insulating layer GI. The first gate electrode GE1 may become a lower electrode LE of a storage capacitor Cst.

A first interlayer insulating layer IL1 may be provided on the substrate SUB on which the (i-1)th scan line Si-1 and/or the like are formed.

An upper electrode UE of the storage capacitor Cst and an initialization power line IPL may be provided on the first interlayer insulating layer IL1.

A second interlayer insulating layer IL2 may be provided on the substrate SUB on which the upper electrode UE and the initialization power line IPL are disposed.

A data line Dj, a connection line CNL, an auxiliary connection line AUX, a first bridge pattern BRP1, and a first conductive layer PL1 of a power line PL may be provided on the second interlayer insulating layer IL2.

A third interlayer insulating layer IL3 may be provided on the substrate SUB on which the data line Dj and/or the like are formed. The third interlayer insulating layer IL3 may include at least one of an organic insulating layer and an inorganic insulating layer. For example, the third interlayer insulating layer IL3 may include a first sub-insulating layer IL31 including an inorganic insulating layer, and a second sub-insulating layer IL32 disposed on the first sub-insulating layer IL31, the second sub-insulating layer IL32 including an organic insulating layer.

A second bridge pattern BRP2 and a second conductive layer PL2 of the power line PL may be provided on the third interlayer insulating layer IL3. The second conductive layer PL2 may include a plurality of first conductive lines CL1 and a plurality of second conductive lines CL2 crossing the first conductive lines CL1. One of the first conductive lines CL1 and the second conductive lines CL2 overlap with the first conductive layer PL1, and may be electrically connected to the first conductive layer PL1.

A protective layer PSV may be provided on the third interlayer insulating layer IL3 on which the second conductive layer PL2 and the second bridge pattern BRP2 are provided.

An organic light emitting device OLED may be provided on the protective layer PSV. The organic light emitting device OLED may include a first electrode AD, a second electrode CD, and an emitting layer EML provided between the first electrode AD and the second electrode CD.

An encapsulation layer SLM that isolates the organic light emitting device OLED from an external environment may be provided over the organic light emitting device OLED.

In an embodiment of the present disclosure, the third interlayer insulating layer IL3 may include a concave part CCP provided in a region in which the second conductive layer PL2 and the first electrode AD overlap with each other, and the second conductive layer PL2 may be disposed in the concave part CCP. The concave part CCP may be a region in a portion of the third interlayer insulating layer IL3 is removed. For example, in the region in which the second conductive layer PL2 and the first electrode AD overlap with each other, the concave part CCP may be a concave region at which a partial thickness of the second sub-insulating layer IL32 is removed. That is, in the second sub-insulating layer IL32, a thickness of the region in which the second conductive layer PL2 and the first electrode AD overlap with each other may be smaller than that of the other region.

In an embodiment of the present disclosure, because the second conductive layer PL2 is disposed at the concave part CCP in the region in which the second conductive layer PL2 and the first electrode AD overlap with each other, a distance between the second conductive layer PL2 and the first electrode AD may increase. When the distance between the second conductive layer PL2 and the first electrode AD increases in the region in which the second conductive layer PL2 and the first electrode AD overlap with each other, a thickness of the protective layer PSV may increase. The protective layer PSV may include an organic insulating layer. As a thickness of the organic insulating layer increases, the organic insulating layer may have a planarized surface by removing a step difference of a lower structure thereof. Therefore, an interface between the protective layer PSV and the first electrode AD may be a flat surface.

Because a surface of the first electrode AD is influenced by a lower layer of the first electrode AD, i.e., a surface of the protective layer PSV, the surface of the first electrode AD may have a planarized shape. When the surface of the first electrode AD has the planarized shape, the display device including the organic light emitting device OLED can prevent or reduce WAD caused by surface non-uniformity of the first electrode AD.

As described above, according to the present disclosure, the display device removes a step difference generated at a lower portion of an organic light emitting device, so that light generated from the organic light emitting device can be uniformly emitted according to directions thereof. Thus, it is possible to prevent or reduce WAD according to viewing angles of the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various suitable changes in form and details may be made without departing from the spirit and scope of the present disclosure as set forth in the following claims and their equivalents.

What is claimed is:
1. A display device comprising:
a substrate comprising a pixel region and a peripheral region;
pixels in the pixel region of the substrate, each of the pixels comprising a light emitting device having a light emitting region, the light emitting device comprising a first electrode, an emitting layer, and a second electrode;

data lines and scan lines connected to the pixels;

a power line configured to supply power to the light emitting device, the power line comprising a first conductive layer at a same layer as the data lines and a second conductive layer on the first conductive layer; and an insulating layer between the power line and the first electrode, wherein the first electrode, the emitting layer, and the second electrode overlap at the light emitting region, wherein the second conductive layer comprises a first portion corresponding to the light emitting region and a second portion not corresponding to the light emitting region, and wherein the second portion is closer to the first electrode than the first portion when viewed in a direction normal to a major surface of the substrate.

2. The display device of claim 1, wherein the insulating layer comprises a concave part at a region in which the light emitting device and the power line overlap with each other, and wherein at least a portion of the second conductive layer is in the concave part.

3. The display device of claim 2, wherein the insulating layer comprises a first insulating layer and a second insulating layer on the first insulating layer.

4. The display device of claim 3, wherein the first insulating layer comprises:
a first sub-insulating layer on the first conductive layer; and
a second sub-insulating layer on the first sub-insulating layer, the second sub-insulating layer comprising an organic insulating layer.

5. The display device of claim 4, wherein the concave part comprises a region in which a portion of the second sub-insulating layer is removed to expose the first sub-insulating layer therethrough.

6. The display device of claim 3, wherein the first insulating layer comprises an organic insulating layer, and wherein the concave part exposes the first conductive layer therethrough.

7. The display device of claim 6, wherein, at the concave part, the second conductive layer is in direct contact with the first conductive layer.

8. The display device of claim 2, wherein the second conductive layer comprises:
a plurality of first conductive lines extending in one direction; and
a plurality of second conductive lines crossing the first conductive lines,
wherein the plurality of first conductive lines and the plurality of second conductive lines are electrically connected to each other.

9. The display device of claim 8, wherein the second conductive layer has a mesh form.

10. The display device of claim 9, wherein the first conductive lines extend in a direction parallel to the data lines or the scan lines.

11. The display device of claim 3, wherein the second insulating layer has a planarized surface, and wherein, in the second insulating layer, a thickness of a region corresponding to the concave part is greater than that of another region when viewed in a direction normal to the major surface of the substrate.

12. The display device of claim 11, further comprising at least one transistor connected to the light emitting device,
wherein the first electrode is on the at least one transistor, the emitting layer is on the first electrode, and the second electrode is on the emitting layer.

13. The display device of claim 12, wherein an interface between the second insulating layer and the first electrode has a flat surface.

14. The display device of claim 1, wherein the first conductive layer comprises a third portion corresponding to the light emitting region and a fourth portion not corresponding to the light emitting region.

15. The display device of claim 14, wherein the third portion corresponds to at least a part of the first portion and the fourth portion corresponds to at least a part of the second portion.

* * * * *